(12) United States Patent
Tsuda et al.

(10) Patent No.: US 10,187,009 B2
(45) Date of Patent: Jan. 22, 2019

(54) METHOD FOR DIAGNOSING SOLAR CELL MODULE, AND DIAGNOSTIC CIRCUIT AND DIAGNOSTIC SYSTEM FOR SOLAR CELL MODULE

(71) Applicant: Mitsubishi Electric Corporation, Chiyoda-ku (JP)

(72) Inventors: Mutsumi Tsuda, Tokyo (JP); Yasutoshi Yashiki, Tokyo (JP); Tomohiro Ikeda, Tokyo (JP); Kaoru Motonami, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 313 days.

(21) Appl. No.: 15/304,013

(22) PCT Filed: Apr. 21, 2015

(86) PCT No.: PCT/JP2015/062140
§ 371 (c)(1),
(2) Date: Oct. 13, 2016

(87) PCT Pub. No.: WO2015/163329
PCT Pub. Date: Oct. 29, 2015

(65) Prior Publication Data
US 2017/0033735 A1    Feb. 2, 2017

(30) Foreign Application Priority Data
Apr. 23, 2014  (JP) ................................ 2014-088814

(51) Int. Cl.
*H02S 50/10*   (2014.01)
*G01R 31/26*   (2014.01)
*H02S 50/00*   (2014.01)

(52) U.S. Cl.
CPC .............. *H02S 50/10* (2014.12); *G01R 31/26* (2013.01); *H02S 50/00* (2013.01)

(58) Field of Classification Search
CPC .......... H02S 50/10; H02S 50/00; G01R 31/26
(Continued)

(56) References Cited

U.S. PATENT DOCUMENTS

2013/0088252 A1 *  4/2013  Brabetz ................ G01R 31/026
324/761.01

FOREIGN PATENT DOCUMENTS

| JP | 2001-85708 A | 3/2001 |
|---|---|---|
| JP | 2009-21341 A | 1/2009 |

(Continued)

OTHER PUBLICATIONS

International Search Report dated Jun. 9, 2015, in PCT/JP2015/062140 filed Apr. 21, 2015.

*Primary Examiner* — Farhana Hoque
(74) *Attorney, Agent, or Firm* — Oblon, McClelland, Maier & Neustadt, L.L.P.

(57) ABSTRACT

A method for diagnosing a solar cell module includes an analysis of measuring frequency characteristics including a resonance point of impedance between two poles of a solar cell module, and frequency characteristics including a resonance point of impedance between an output cable and a frame, and determining equivalent circuit constants of the solar cell module, and a determination of comparing the equivalent circuit constants determined in the analysis with equivalent circuit constants obtained previously to determine change in condition of the solar cell module.

10 Claims, 17 Drawing Sheets

(58) Field of Classification Search
USPC .......................................... 324/322, 761.01
See application file for complete search history.

(56) References Cited

FOREIGN PATENT DOCUMENTS

| | | |
|---|---|---|
| JP | 4604250 B2 | 10/2010 |
| JP | 2010-249749 A | 11/2010 |
| JP | 2013-4566 A | 1/2013 |
| JP | 2013-24697 A | 2/2013 |
| JP | 2013-84660 A | 5/2013 |
| JP | 2013-527613 A | 6/2013 |
| JP | 2013-182948 A | 9/2013 |
| JP | 2013-228794 A | 11/2013 |
| JP | 2014-11270 A | 1/2014 |
| JP | 2014-165232 A | 9/2014 |
| WO | WO 2014/057890 A1 | 4/2014 |

\* cited by examiner (a)

(b)

(a)

(b)

METHOD FOR DIAGNOSING SOLAR CELL MODULE, AND DIAGNOSTIC CIRCUIT AND DIAGNOSTIC SYSTEM FOR SOLAR CELL MODULE

FIELD

The present invention relates to a method for diagnosing the condition of a solar cell module, and a diagnostic circuit and a diagnostic system to be connected to a solar cell module for diagnostic use.

BACKGROUND

Photovoltaic generation has been highly expected as an energy source alternative to thermal power generation and atomic power generation. The production volume of solar cells in recent years has increased dramatically. For solar cells, crystalline solar cells, solar cells formed by using a single crystal or polycrystalline silicon substrate, or thin-film solar cells, solar cells formed by depositing a silicon thin film on a glass substrate, are used. A unit of installation of solar cells in a photovoltaic power system is a solar cell module. A plurality of solar cells described above is connected in series or in parallel in a panel according to a purpose, and is provided with a frame constituting an outer frame and terminal boxes, to function as a solar cell module. A large number of solar cell modules mounted on a base, a power transmission cable, a power conditioner, and others are combined to constitute a photovoltaic power system. Such systems are not limited to general home power generation applications, and are also used in large-scale photovoltaic power plants having an amount of power generation of 1 MW or higher.

Solar cell modules do not have mechanically operating portions, and their lives are said to be generally twenty years or longer. However, in actuality, there have been reported cases where malfunctions occurred within several years or less after the start of operation due to various causes. Known causes of malfunctions include increased resistance due to degradation of a power generation layer in solar cells or corrosion of electrode portions, reduced optical transmittance of a sealing material that fills surrounding areas of solar cells to protect the solar cells, degraded insulation, increased wiring resistance in a solar cell module, and grounding failure of a metal base to which a solar cell module is fixed. These malfunctions cause reduced output of a solar cell module, and may finally lead to faulty functioning. A diagnostic technique capable of detecting such degradation states of solar cell modules at an early stage has been required to increase the reliability of photovoltaic power systems and to spread the use of them further.

When one or some solar cell modules in a photovoltaic power system fail, a malfunction can occur over the entire system. Therefore, it is ideal to periodically determine whether degradation is occurring on each solar cell module, and to repair or replace solar cell modules with appropriate timing. This requires a degradation diagnosing technique or a failure predicting technique for solar cell modules.

As matters now stand, as a method for checking the operating condition of a solar cell module, a method for measuring generated current or voltage and monitoring the amount of power generation is typical. However, the amount of power generation of a solar cell module varies greatly depending on an external factor such as the amount of solar radiation or weather conditions at the time of measurement. Therefore, only by monitoring the current, the voltage, or the amount of power generation of a solar cell module, it is difficult to determine whether the module is operating normally. Specifically, by monitoring the power generation amount as described above, the so-called "0" or "1" determination such as "operating" or "not operating" is possible, but it is difficult to determine whether an abnormality has occurred in a solar cell module based on a situation where the amount of power generation has decreased in an actual installation environment where the amount of solar radiation varies every moment. Further, when a photovoltaic power system is constructed, it is difficult to determine on site whether there is a malfunction in connections between modules or there is a problem in modules themselves at the time of completion of the construction.

To this situation, a module diagnostic method using high frequencies has been proposed in recent years. Ac voltage of various frequencies is applied to a solar cell module using a variable-frequency signal generator to measure the frequency dependence of the impedance of the solar cell module, based on a current and voltage waveform at each frequency. From a frequency characteristic curve obtained by the measurement and impedance frequency response characteristics given by an equivalent circuit model of the solar cell module, equivalent circuit constants, characteristic variables unique to the module measured, can be obtained. By comparison between the values of these constants and values when the panel is normal, an increase in series resistance of electrodes or wiring can be detected to detect the occurrence of excessive contact resistance. As an example of the equivalent circuit model for the solar cell module, an equivalent circuit including four circuit elements, inductance L of tab wiring and output cables of the module, series resistance $R_s$ of wiring and electrode portions, and junction capacitance $C_d$ and insulation resistance $R_{sh}$ of a power generation layer of the solar cells is used (see Patent Literature 1, for example).

CITATION LIST

Patent Literature

Patent Literature 1: JP 2013-527613 A

SUMMARY

Technical Problem

For a sealant of a solar cell module, a polymeric material such as ethylene-vinyl acetate (EVA) is typically used. Long-term outdoor use causes the material to be exposed to ultraviolet radiation or subjected to moisture intrusion from the edge of the module, to be degraded over time. Patent Literature 1 shows a diagnostic method not depending on solar radiation, but assumes that impedance between two poles of a solar cell module is measured. Therefore, it can detect degradation of a power generation layer of solar cells and a resistance failure of electrodes or wiring portions in the module, but has difficulty in detecting characteristic degradation of the optical transmittance or electrical insulation of a sealing material that fills a space between the solar cells and a metal frame. Further, it has been known that when a sealant is EVA, it reacts with moisture entering the module, generating acetic acid, so that the degradation of EVA cause corrosion of electrodes or wiring in the module. Thus, there is a strong demand for a diagnostic device and a diagnostic method for modules that can also detect a characteristic change of a sealant.

The present invention has been made in view of the above, and has an object of providing a comprehensive method for diagnosing a solar cell module that can quantitatively detect the degree of degradation of a sealing material in addition to degradation of solar cells and resistance failure of electrodes and wiring portions of the module.

Solution to Problem

According to an aspect of the present invention, there is provided a diagnostic method for performing diagnosis of a solar cell module having a conductive frame by measuring frequency characteristics of impedance of the solar cell module during a period of time when solar cells included in the solar cell module do not generate power, using a frequency-variable impedance measuring device connected to the solar cell module, the method including: an analysis step of measuring frequency characteristics including a resonance point of impedance between two output cables of the solar cell module, and frequency characteristics including a resonance point of impedance between one of the two output cables and the frame, and determining equivalent circuit constants of the solar cell module from the frequency characteristics measured; and a determination step of comparing the equivalent circuit constant determined in the analysis step with equivalent circuit constants obtained previously to determine change in condition of the solar cell module.

According to another aspect of the present invention, there is provided a circuit for diagnosing a solar cell module, including: a circuit unit that connects a first output terminal of a solar cell module having a conductive frame and a blocking capacitor; a circuit unit that connects the blocking capacitor and a measurement terminal of an impedance measuring device; a circuit unit that connects a second output terminal of the solar cell module and a first switch; a circuit unit that connects the first switch and a ground of the impedance measuring device; a resonance point adjustment circuit in which an inductor for resonance point adjustment and a second switch are connected in series; a circuit unit that connects the frame and one end of the resonance point adjustment circuit; and a circuit unit that connects the other end of the resonance point adjustment circuit and the ground of the impedance measuring device.

A system for diagnosing a solar cell module of this invention includes the above-described circuit for diagnosing a solar cell module, the impedance measuring device, a controller that assumes an operation, data storage, and system control and controls the first switch and the second switch in the diagnostic circuit, and a communication unit that transmits impedance information on a solar cell module to the controller, and transmits control signals for the impedance measuring device, the first switch, and the second switch from the controller.

The system for diagnosing a solar cell module of this invention further includes a unit that acquires temperature information on the solar cell module, and a unit that transmits the temperature information acquired to the controller.

Advantageous Effects of Invention

The present invention can quantitatively detect degradation of a solar cell module including characteristic degradation of a sealing material by obtaining and monitoring equivalent circuit constants of the module.

BRIEF DESCRIPTION OF DRAWINGS

FIG. 16(a) is a graph illustrating diagnostic results when temperature correction is not performed; and FIG. 16(b) is a graph illustrating diagnostic results when temperature correction is performed.

DESCRIPTION OF EMBODIMENTS

First Embodiment

A diagnostic circuit and a diagnostic method for a solar cell module according to a first embodiment will be described. A solar cell module to be diagnosed in the present invention is a solar cell module in which, for example, crystalline or thin-film solar cells are mounted. Events to be diagnosed include not only a failure state of the solar cell module but also a degradation state in middle stages leading to a failure.

<Configuration of Diagnostic Circuit>

Figure 1:
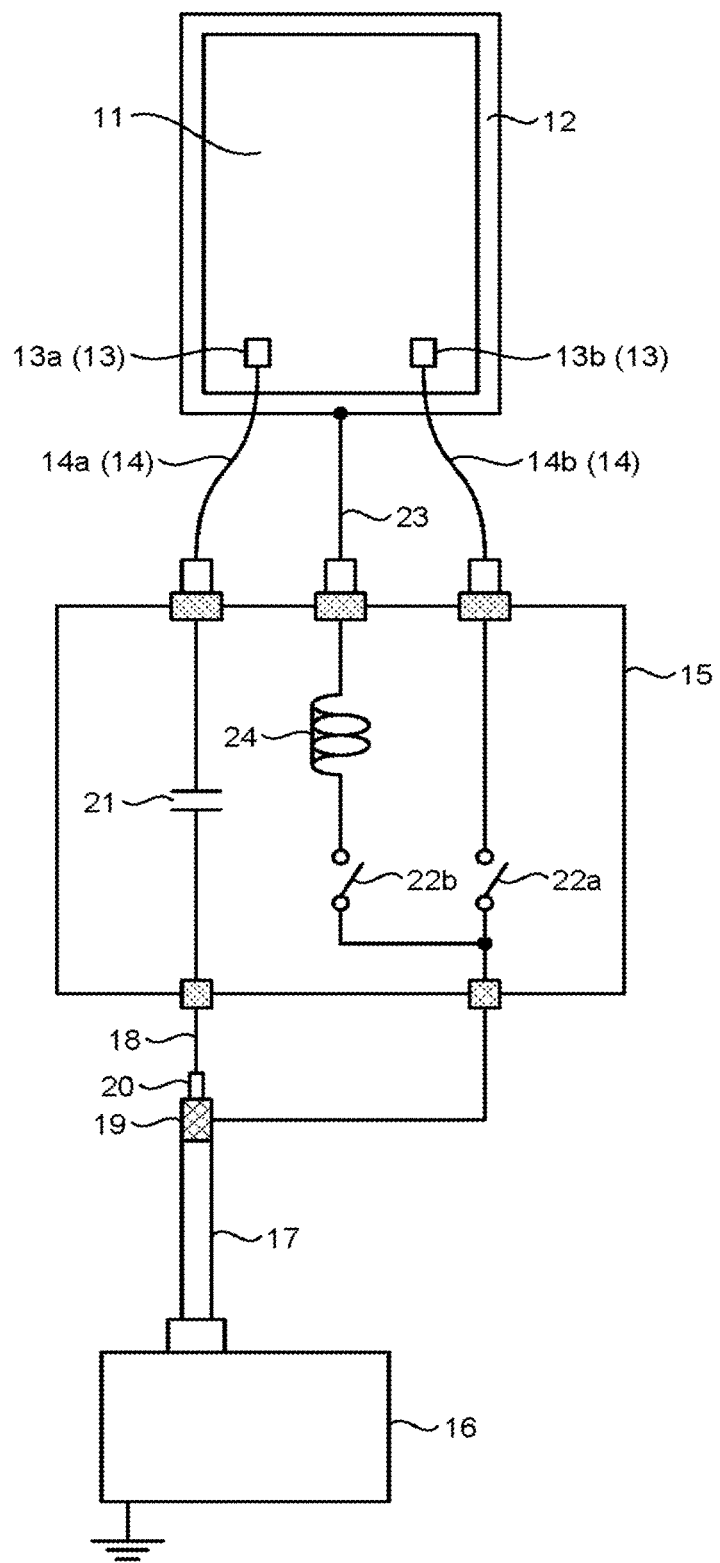
FIG. 1 is a schematic configuration diagram schematically illustrating a diagnostic circuit used for diagnosing a solar cell module according to a first embodiment of this invention.

FIG. 1 is a schematic configuration diagram schematically illustrating a diagnostic circuit for a solar cell module according to the first embodiment. A solar cell module 11 is a solar cell module of a type in which a conductive metal frame 12 is disposed around it, in which a plurality of solar cells are connected in series or in parallel. Two terminal boxes 13a and 13b (hereinafter, terminal boxes 13 when referred to collectively) for taking out power are disposed on the back side of the solar cell module 11. Output cables 14a and 14b (hereinafter, output cables 14 when referred to collectively) for taking out power are connected to output terminals provided to the terminal boxes 13 individually.

In the diagnostic circuit for a solar cell module in the present invention, the output cables 14 are connected to an impedance measuring device 16 via a junction box 15 for diagnosing the solar cell module 11. Specifically, the output terminal of the positive-side terminal box 13a of the solar cell module 11 is connected to a measurement terminal of the impedance measuring device 16 via the output cable 14a, the junction box 15, and a central conductor 18 of a coaxial cable 17. As described below, a blocking capacitor 21 for blocking DC is interposed in the junction box 15 in the middle of the path.

On the other hand, the output terminal of the negative-side terminal box 13b of the solar cell moduli ii is connected to a ground (GND) of the measurement terminal of the impedance measuring device 16 via the output cable 14b, the junction box 15, and an external conductor 19 of the coaxial cable 17. This connection can be cut off by turning off a first switch 22a in the junction box 15 disposed halfway. In this case, the negative-side terminal box 13b of the solar cell module 11 is electrically insulated from the ground of the impedance measuring device 16. Here, in the coaxial cable 17, the external conductor 19 is electrically insulated from the central conductor 18 via a dielectric 20.

The metal frame 12 of the solar cell module 11 is connected to the ground of the impedance measuring device 16 via a ground wire 23, an inductor for resonance point adjustment 24 provided in the junction box 15, and the external conductor 19 of the coaxial cable 17. This connection can be cut off by turning off a second switch 22b in the junction box 15 disposed halfway. In this case, the metal frame 12 of the solar cell module 11 is electrically insulated from the ground of the measurement terminal of the impedance measuring device 16. The inductor for resonance point adjustment 24 and the second switch 22b are directly connected to constitute a resonance point adjustment circuit. The inductor for resonance point adjustment 24 and the second switch 22b may change places with each other. The switches 22a and 22b may be manual toggle switches, or may be switching devices such as diode switches or metal-oxide-semiconductor field-effect transistors (MOSFETs) driven by a gate signal.

Here, the impedance measuring device 16 is a measuring instrument that measures impedance using high frequencies, and can measure the frequency characteristics of impedance since the measurement frequency can be practically swept. Practically sweeping the measurement frequency means an operation of continuously sweeping the frequency or discretely sweeping the frequency at regular intervals, by which a resonance point is determined. As the impedance measuring device 16 like this, for example, a network analyzer, an impedance analyzer, a combination analyzer, or the like are commercially available. Alternatively, it may be a combination of a variable-frequency high-frequency transmitter, a current sensor, a voltage sensor, and an A/D converter or an arithmetic unit.

A casing of the impedance measuring device 16 illustrated in FIG. 1 is grounded by a 3-pole type outlet or a ground wire, but does not necessarily need to be grounded. Measurement may be performed with the casing of the impedance measuring device 16 electrically isolated. The metal frame 12 of the solar cell module 11 illustrated in FIG. 1 is grounded by the ground wire 23 via the casing of the impedance measuring device 16 when the second switch 22b is on. Alternatively, using a different ground wire, the metal frame 12 may be grounded separately. The presence or absence of grounding of the casing of the impedance measuring device 16 and the metal frame 12 of the solar cell module 11 hardly influences the results of diagnosis of a solar cell module in the present invention. The above-described configuration constitutes the diagnostic circuit for a solar cell module.

The impedance measurement of the solar cell module 11 is performed basically during nighttime hours when solar cells included in the solar cell module 11 do not generate power, that is, when they are under dark conditions. When light accidentally enters a light-receiving surface of the solar cell module 11 during measurement, the solar cells in the solar cell module 11 generate power, producing a DC voltage up to about some tens of volts, for example, between the terminal boxes 13a and 13b. For such a case, the blocking capacitor 21 for blocking DC is interposed between the solar cell module 11 and the measurement terminal of the impedance measuring device 16 to protect the impedance measuring device 16 from an overvoltage as described above. On the other hand, a high-frequency signal for measurement provided from the measurement terminal of the impedance measuring device 16 to the solar cell module 11 easily passes through the blocking capacitor 21 because its frequency is adequately high, and can propagate to the solar cell module 11.

<Diagnostic Method>

Figure 2:
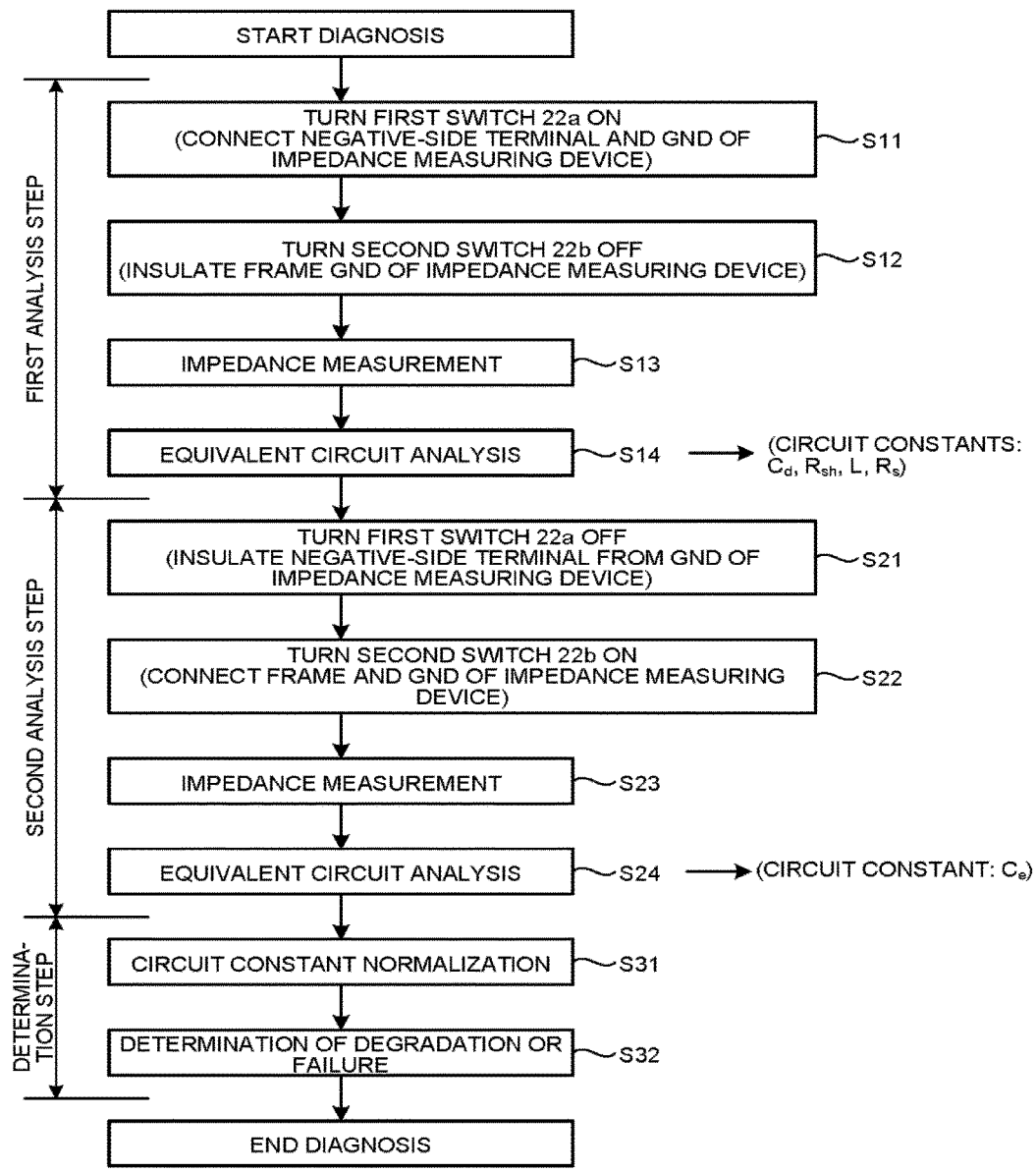
FIG. 2 is a flowchart illustrating an example of a diagnosing process using the diagnostic circuit for the solar cell module according to the first embodiment of this invention.

Next, a method for diagnosing the solar cell module 11 using this diagnostic circuit will be described in detail. FIG. 2 is a flowchart illustrating an example of a process of solar cell module diagnosis according to the first embodiment, which, when divided broadly, includes three steps, a first analysis step, a second analysis step, and a determination step. Here, a method for diagnosing the presence or absence of a failure or the degree of degradation of the solar cell module 11 by using a network analyser as the impedance measuring device 16 and measuring the impedance of the solar cell module 11 by the so-called one-port reflection method will be described.

Upon starting the diagnosis of a solar cell module, first, the first analysis step is performed. The first switch 22a in the junction box 15 is turned on to electrically connect the output terminal of the negative-side terminal box 13b of the solar cell module 11 and the external conductor 19 of the coaxial cable 17 and the ground of the impedance measuring device 16 (S11). Next, the second switch 22b in the junction box 15 is turned off to electrically insulate the metal frame 12 of the solar cell module 11 from the ground of the impedance measuring device 16 (S12). With the first switch 22a on and the second switch 22b off, the impedance measuring device 16 measures the impedance of the solar cell module 11, that is, impedance between the output cable 14a and the output cable 14b of the solar cell module 11 (S13).

In this measurement, impedance between the output cable 14a and the output cable 14b of the solar cell module 11 with the metal frame 12 of the solar cell module 11 electrically insulated from the ground of the impedance measuring device 16 has been measured. Finally, a circuit analysis using an equivalent circuit model of the solar cell module 11 constituting a first equivalent circuit described below is performed on impedance measurement results obtained to determine four basic circuit constants $C_d$, $R_{sh}$, L, and $R_s$ of equivalent circuit constants unique to the solar Cell module 11 (S14). Here, $C_d$ is the junction capacitance of the solar cells in the solar cell module 11, $R_{sh}$ is the insulation resistance of the solar cells, L is the total inductance of the output cables 14 and tab wiring in the module, and $R_s$ is the series resistance of electrode portions of the solar cells or the tab wiring of the module. Details of the impedance measurement (S13) and the equivalent circuit analysis (S14) will be described below.

When the first analysis step is completed, the second analysis step is performed successively. The first switch 22a in the junction box 15 is switched off to electrically insulate the output terminal of the negative-side terminal box 13b of the solar cell module 11 from the external conductor 19 of the coaxial cable 17 and the ground of the impedance measuring device 1 (S21). Next, the second switch 22b in the junction box 15 is switched on to electrically connect the metal frame 12 of the solar cell module 11 and the ground of the impedance measuring device 16 (S22). With the first switch 22a off and the second switch 22b on, the impedance measuring device 16 measures the impedance of the solar cell module 11, that is, impedance between the output cable 14a and the metal frame 12 of the solar cell module 11 (S23).

In this measurement, impedance between the positive-side output cable 14a and the metal frame 12 of the solar cell module 11 has been measured. A circuit analysis using an equivalent circuit model of the solar cell module 11 constituting a second equivalent circuit described below is performed on impedance measurement results obtained to determine $C_e$, a remaining circuit constant of the solar cell module 11 (S24). Here, $C_e$ is a parasitic capacitance between the tab wiring and the metal frame 12 of the solar cell module 11, and is proportional to the dielectric constant of a sealant located between the tab wiring and the frame. Details of the impedance measurement (S23) and the equivalent circuit analysis (S24) will be described below.

In the last determination step, the five circuit constants $C_d$, $R_{sh}$, L, $R_s$, and $C_e$ determined in the first and second analysis steps are normalized by their respective initial values (S31). The initial values are, for example, values obtained previously when the solar cell module is installed on site and diagnosis is started, and are used as values when the solar cell module is normal. That is, the normalization of the circuit constant values by the initial values equivalently corresponds to comparison of the circuit constant values with the values when the solar cell module 11 is normal. Next, determination of degradation or failure, in which the normalized values are compared with preset thresholds to determine whether the solar cell module 11 needs to be repaired or replaced or not, is performed (S32). For example, when the normalized value of the insulation resistance $R_{sh}$ of the solar cells becomes the threshold for the insulation resistance or lower, or when the normalized value of the series resistance $R_s$ of the module becomes larger than the threshold for the series resistance, it can be determined that the solar cell module needs to be repaired or replaced. By watching the rates of change between a plurality of times on the normalized values of the equivalent circuit constants $C_d$, $R_{sh}$, L, $R_s$, and $C_e$, the time of failure of the solar cell module 11 can be predicted. In this case, a user can be notified of the predicted time of failure by a visual method such as displaying a message or lighting a lamp. Thus, the degree of degradation of the solar cell module 11 can be diagnosed quantitatively.

In the impedance measurement using the network analyzer in the first and second analysis steps, a weak high-frequency signal is transmitted from the measurement terminal of the impedance measuring device 16 to the solar cell module 11, and the electric power of its incident wave and the electric power of a reflected wave returned from the solar cell module 11 to the impedance measuring device 16 are measured individually. The impedance measuring device 16 determines a reflection coefficient from the amplitude ratio and the phase difference between the incident wave and the reflected wave, and finally can obtain the impedance $Z_{PV}$ of the solar cell module 11. In this measurement, the frequency F of the high-frequency signal is swept in a range of $F_1 < F < F_2$ wherein $F_1$ is a lower limit and $F_2$ is an upper limit, to obtain the frequency F dependence of the impedance $Z_{PV}$ of the solar cell module 11.

Figure 3:
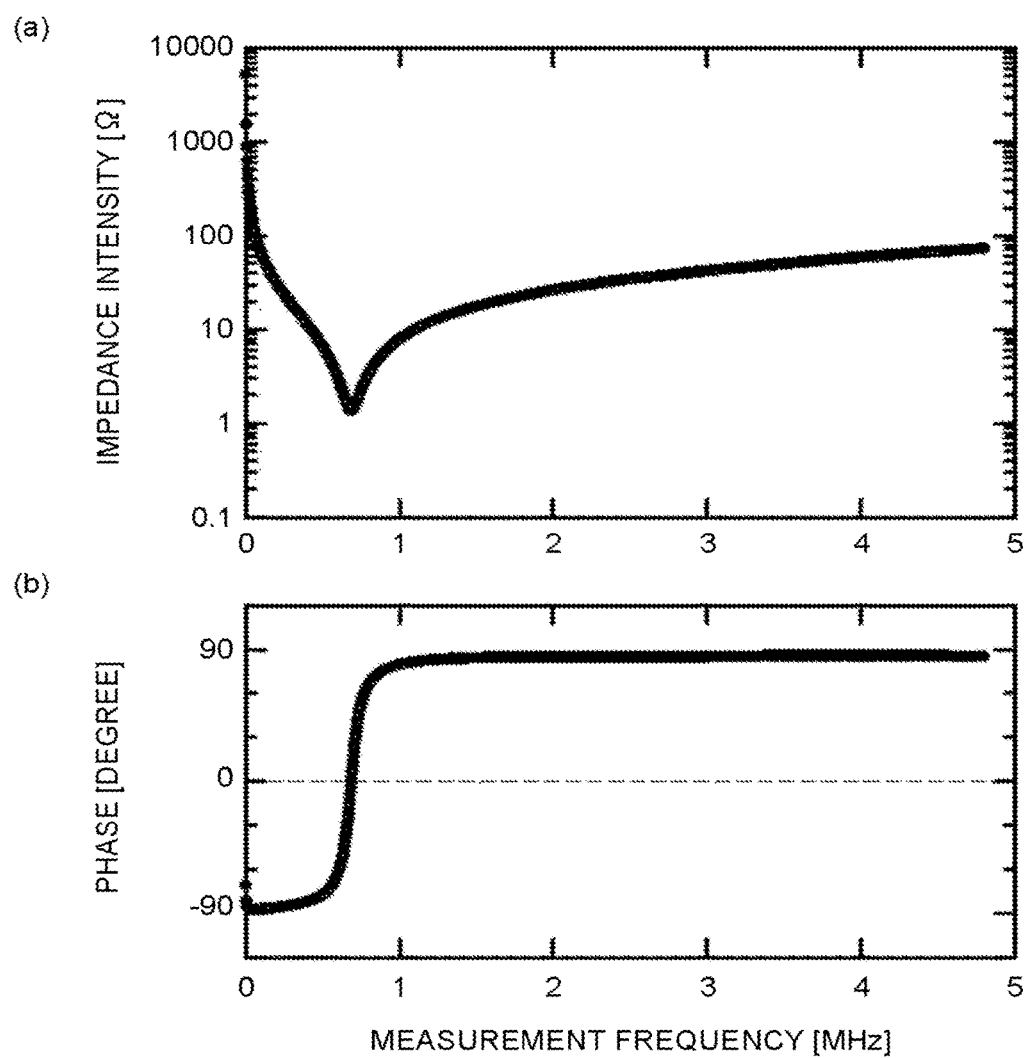
FIG. 3 is a graph illustrating an example of the results of measuring the impedance of the solar cell module using the diagnostic circuit for the solar cell module according to the first embodiment of this invention.

An example of the results of measuring the impedance $Z_{PV}$ of the solar cell module 11 with the first switch 22a turned on and the second switch 22b turned off in the junction box 15, and with the metal frame 12 of the solar cell module 11 insulated from the ground of the measurement terminal of the impedance measuring device 16 in the first analysis step will be described. FIG. 3(a) shows the dependence of the intensity of the impedance $Z_{PV}$ between output cables 14 of the solar cell module 11 on the frequency F, and FIG. 3(b) shows the dependence of the phase of the impedance $Z_{PV}$ on the frequency F. FIG. 3 is the results of measuring the impedance $Z_{PV}$ of the solar cell module 11 while increasing the frequency F from $F_1$ to $F_2$ with the lower limit frequency set at $F_1$=1 kHz and the upper limit frequency at $F_2$=4.8 MHz, for example, when the measurement was performed at night when the solar cell module 11 is under dark conditions under which it does not generate power. For the solar cell module, a module of outer dimensions of 120 cm×100 cm using thin-film cells was used.

When the frequency is increased gradually from F=1 kHz, the intensity of the impedance $Z_{PV}$ of the solar cell module 11 illustrated in FIG. 3(a) first decreases, and indicates a smallest value at a frequency of F=0.69 MHz, and then increases again. On the other hand, the phase of the impedance $Z_{PV}$ illustrated in FIG. 3(b) changes suddenly from −90° that indicates a capacitive load to +90° that indicates a inductive load in the vicinity of a frequency of F=0.69 MHz, and indicates a substantially flat characteristic at F>1 MHz.

As illustrated in FIG. 3, the frequency dependence of the impedance $Z_{PV}$ between the output cables 14 of the solar cell module 11 measured in the first analysis step indicates a typical series resonance characteristic. When a frequency at a resonance point where the intensity of $Z_{PV}$ is minimum and its phase is 0°, that is, a resonance frequency $F_{res}$ was determined, $F_{res}$=0.69 MHz. The smallest value of the impedance was $Z_{PV}$=1.37Ω (@ 0.69 MHz).

Figure 4:
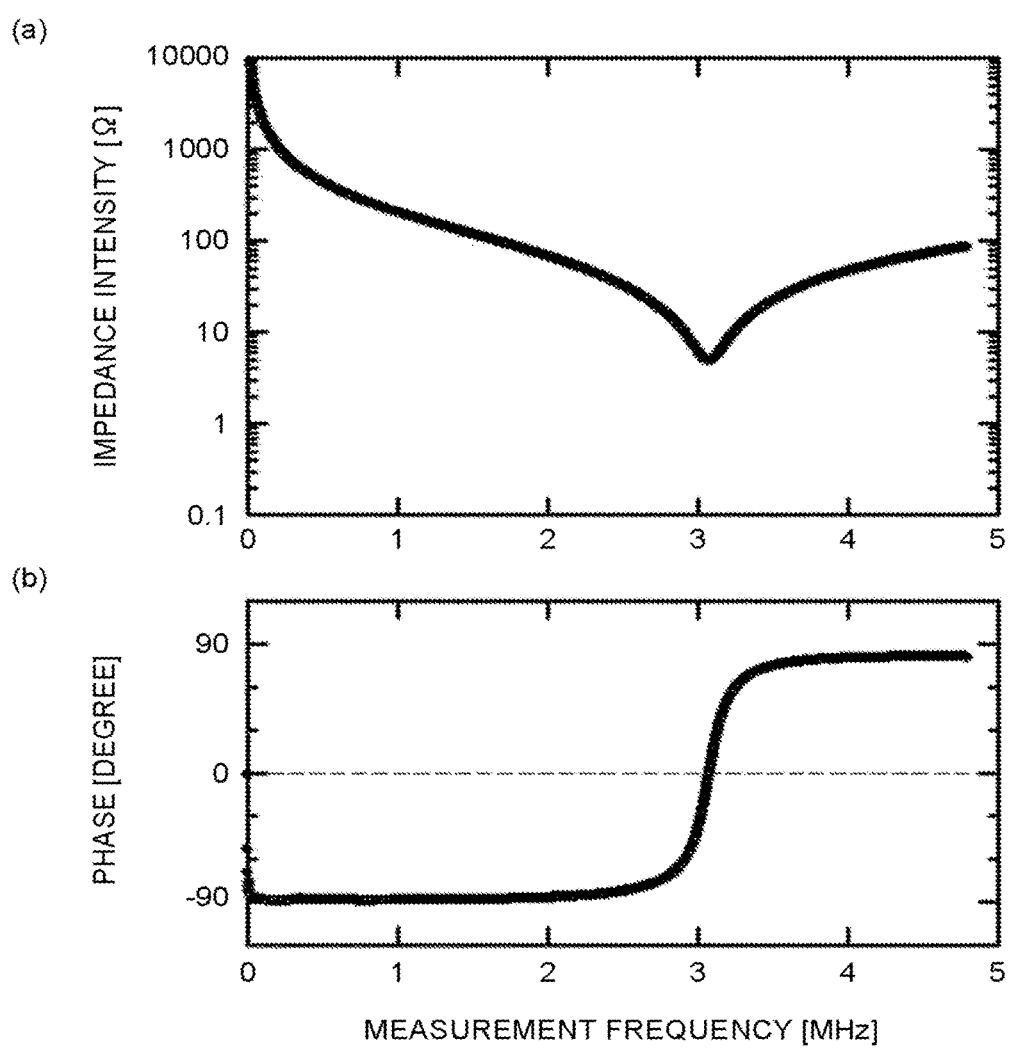
FIG. 4 is a graph illustrating an example of the results of measuring the impedance of the solar cell module using the diagnostic circuit for the solar cell module according to the first embodiment of this invention.

Next, an example of the results of measuring the impedance $Z_{PV}$ of the solar cell module 11 with the first switch 22a turned off and the second switch 22b turned on in the junction box 15 in the second analysis step will be illustrated. FIG. 4(a) shows the dependence of the intensity of the impedance $Z_{PV}$ between the positive-side output cable 14a and the metal frame 12 of the solar cell module 11 on the frequency F, and FIG. 4(b) shows the dependence of the chase of the impedance $Z_{PV}$ on the frequency F. FIG. 4 is the results of measuring the impedance $Z_{PV}$ of the solar cell module 11 while increasing the frequency F from $F_1$ to $F_2$ with the lower limit frequency set at $F_1$=1 kHz and the upper limit frequency at $F_2$=4.8 MHz, for example, when the measurement was performed during the nighttime when the solar cell module 11 does not generate power.

As illustrated in FIG. 4, the frequency dependence of the impedance $Z_{PV}$ between the positive-side output cable 14a and the metal frame 12 of the solar cell module 11 measured in the second analysis step indicates a series resonance characteristic as in FIG. 3 illustrating the results of the first analysis step. When the resonance frequency $F_{res}$ was determined, $F_{res}$=3.08 MHz. The smallest value of the impedance was $Z_{PV}$=4.86Ω (@ 3.08 MHz).

These resonance frequencies and smallest Impedance values depend on the condition of the solar cell module. Therefore, by measuring and monitoring these numerical values, the condition of the solar cell module (e.g. the degree of degradation) can be continuously grasped and managed.

However, from changes in numerical values such as the resonance frequencies and the impedance smallest values, it is not directly determined in what part of the solar cell module a problem has occurred. In order to identify a malfunctioning part, the solar cell module can be replaced with an equivalent circuit. When the value of a specific element such as series resistance in the equivalent circuit changes, it can be considered that a malfunction has occurred in a part such as an electrode or a wiring portion corresponding to the element. By thus grasping and managing the equivalent circuit constants unique to the solar cell module, diagnosis can be performed on the condition of the solar cell module.

Figure 5:
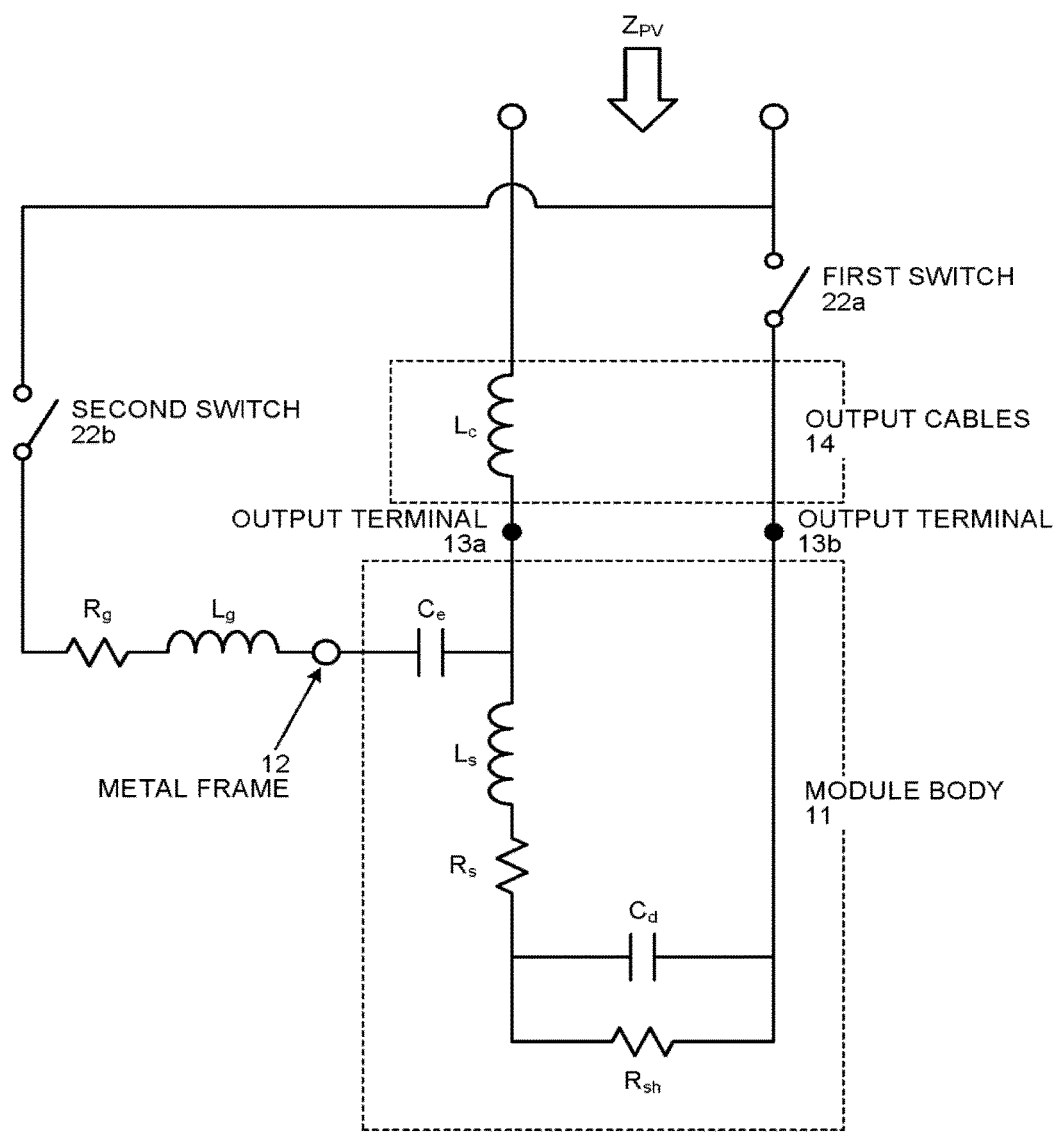
FIG. 5 is a diagram illustrating an equivalent circuit model of the solar cell module according to the first embodiment of this invention.

FIG. 5 shows an equivalent circuit model of the solar cell module 11 illustrated in FIG. 1 under dark conditions. The output cables 14 of the solar cell module 11 can be represented only by the inductance $L_c$ of the cables since their length is relatively short, and their resistive components can be ignored. On the other hand, the body of the solar cell module 11 can be represented by a series and parallel circuit as illustrated in FIG. 5, using the series resistance $R_s$ and the parasitic inductance $L_s$ of the tab wiring and the electrode portions inside, and further the junction capacitance $C_d$ and the insulation resistance $R_{sh}$ of the power-generating layer of the solar cells. A state where the second switch 22b in the junction box 15 is off constitutes a first equivalent circuit.

A state where the second switch 22b in the junction box 15 is on, that is, the metal frame 12 is connected to the ground of the measurement terminal of the impedance measuring device 16 constitutes a second equivalent circuit. Since the distance between the tab wiring disposed at the outer edge of the solar cell module 11 and the metal frame 12 is relatively short, about some millimeters, a series circuit including the parasitic capacitance $C_e$ between the tab wiring and the metal frame 12, the series resistance $R_g$ of the ground wire 23 connecting the metal frame 12 and the junction box 15, and the inductance $L_g$ of the inductor for resonance point adjustment 24 also needs to be considered in the equivalent circuit in FIG. 5. Conversely, when the second switch 22b in the junction box 15 is turned off to insulate the metal frame 12 from the ground of the measurement terminal of the impedance measuring device 16, a circuit portion including the parasitic capacitance $C_e$ can be ignored.

A space between the tab wiring and the metal frame 12 of the solar cell module is typically filled with a sealant made of a resin such as ethylene-vinyl acetate (EVA). The parasitic capacitance $C_e$ of the tab wiring also depends on the dielectric constant of the sealant. Thus, by continuously monitoring the value of $C_e$ of the solar cell module, it is considered to be possible to quantitatively grasp the degree of degradation and change in quality of the sealant.

The impedance $Z_{PV}$ of the solar cell module 11 measured in the first analysis step is considered to be able to be expressed by the following expression (1) since the first switch 22a is turned on and the second switch 22b off in the junction box 15, and thus the parasitic capacitance $C_e$ of the tab wiring can be ignored as described above.

[Expression 1]

$$Z_{PV} = R_s + \frac{R_{sh}}{1+(\omega R_{sh} C_d)^2} + j\left[\omega L - \frac{\omega R_{sh}^2 C_d}{1+(\omega R_{sh} C_d)^2}\right] \quad (1)$$

Here, ω represents an angular frequency (F=ω/(2π)), L the total inductance L (=$L_c$+$L_s$) of a combination of the inductance $L_c$ of the output cables 14 and the inductance $L_s$ of the module body, and j the imaginary unit of a complex number. When the values of ω and the circuit constants $C_d$, $R_{sh}$, and L satisfy the relationship

[Expression 2]

$$\omega L - \omega R_{sh}^2 C_d / \{1+(\omega R_{sh} C_d)^2\} = 0 \quad (2)$$

the value of the imaginary part of $Z_{PV}$ is zero. At this time, the intensity of $Z_{PV}$ is minimum, and the phase is 0°. That is, this is a resonance condition of the equivalent circuit of the solar cell module 11. When the values of $C_d$, $R_{sh}$, and L are given, the resonance frequency $F_{res}$ is obtained by the following expression (3).

[Expression 3]

$$F_{res} = \frac{1}{2\pi}\sqrt{\frac{1}{LC_d} - \frac{1}{(R_{sh}C_d)^2}} \quad (3)$$

The impedance $Z_{PV}$ of the solar cell module 11, when the frequency range is selected appropriately, indicates the resonance characteristic as illustrated in FIG. 3, for example, and the intensity of $Z_{PV}$ changes greatly in a frequency region in the vicinity of the resonance frequency $F_{res}$. Thus, it is desirable to fit the expression (1) and the expression (3) to measured values in this region. By a fitting operation, four circuit constants $C_d$, $R_{sh}$, L, and $R_s$, fitting parameters in the expressions (1) and (3), can be determined relatively easily.

When the expression (1) is fit, this resonance characteristic does not necessarily need to be used. However, to increase the accuracy of fitting, it is best to perform fitting in a frequency region in the vicinity of the resonance frequency $F_{res}$.

Figure 6:
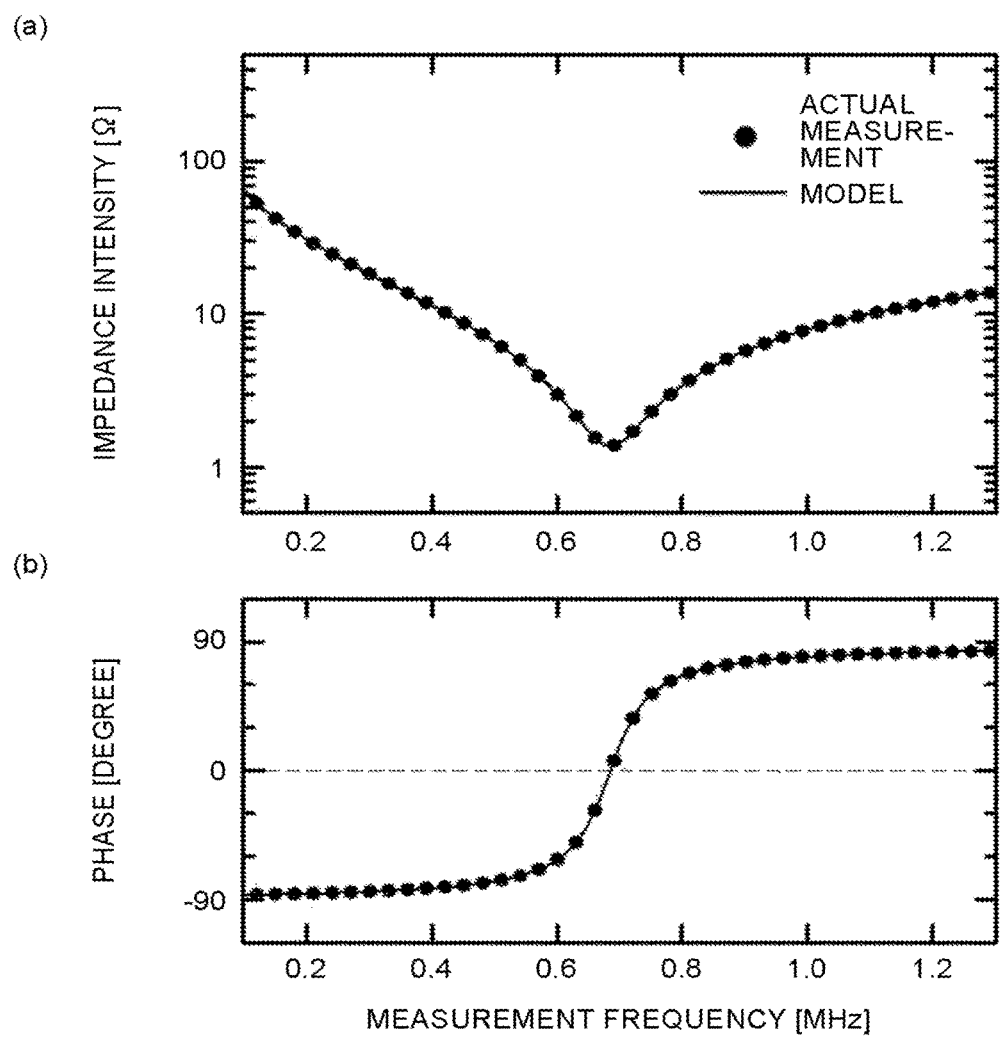
FIG. 6 is a graph illustrating an example of the frequency characteristics of the intensity and the phase of the impedance of the solar cell module, obtained by a method for diagnosing a solar cell module according to the first embodiment of this invention.

As a specific example, FIG. 6 illustrates the results of fitting performed in a frequency region of the frequency between F=0.1 MHz and 1.3 MHz as a region including the resonance frequency $F_{res}$ (=0.69 MHz) in FIG. 3. Here, FIG. 6(a) shows the dependence of the intensity of the impedance $Z_{PV}$ on the frequency F, and FIG. 6(b) shows the dependence of the phase of the impedance $Z_{PV}$ on the frequency F. Circle plots in the figures are measured values of the impedance, and solid lines are the results of fitting the expression (1). It is found that the measured values are in good agreement with the results of the fitting of both the intensity and the phase of the impedance. The values of the equivalent circuit constants obtained by the fitting were, the junction capacitance 25.4 nF, the insulation resistance $R_{sh}$=12.1 kΩ, the module total inductance L (=$L_c$+$L_s$)=2.1 μH, and the series resistance $R_s$=1.5Ω. Thus, in the first analysis step, $C_d$, $R_{sh}$, L, and $R_s$, four basic parameters of the solar cell module, are output.

Next, in the second analysis step, since the first switch 22a is turned off and the second switch 22b on in the junction box 15, the impedance $Z_{PV}$ between the positive-side output cable 14a and the metal frame 1' of the solar cell module 11 is measured. The equivalent circuit in this case is, as already described, a series circuit including the inductance $L_c$ of the output cable 14a, the parasitic capacitance $C_e$ between the tab wiring in the module and the metal frame 12, the series resistance $R_g$ of the ground wire 23 connecting the metal frame 12 and the junction box 15, and the inductance $L_g$ of the inductor for resonance point adjustment 24. Thus, the impedance $Z_{PV}$ measured in the second analysis step is considered to be able to be expressed by the following expression (4).

[Expression 4]

$$Z_{PV} = R_g + j\left[\omega(L_c + L_g) - \frac{1}{\omega C_e}\right] \quad (4)$$

Here, when the values of each frequency ω and the circuit constants $L_c$, $L_g$, and $C_e$ satisfy a relationship of $\omega(L_c+L_g)-1/\omega C_e=0$, the value of the imaginary part of $Z_{PV}$ is zero. At this time, the intensity of $Z_{PV}$ is minimum, and the phase is 0°. Thus, the resonance frequency $F_{res}$ is obtained by the following expression (5).

[Expression 5]

$$F_{res} = \frac{1}{2\pi\sqrt{(L_c + L_g)C_e}} \quad (5)$$

The impedance $Z_{PV}$ of the solar cell module 11, when the frequency range is selected appropriately, indicates the resonance characteristic as illustrated in FIG. 4, for example, and the intensity of $Z_{PV}$ changes greatly in a frequency region in the vicinity of the resonance frequency $F_{res}$. Thus, the expression (4) and the expression (5) can be fit to measured values in this region. This allows three circuit constants $C_e$, ($L_c$+$L_g$), and $R_g$, fitting parameters in the expressions (4) and (5), to be determined relatively easily.

As a specific example, the results of fitting performed in a frequency region of the frequency between F=2 MHz and 4 MHz as a region including the resonance frequency $F_{res}$ (=3.06 MHz) in FIG. 4 will be described. Here, FIG. 7(a) shows the dependence of the intensity of the impedance $Z_{PV}$ on the frequency F, and FIG. 7(b) shows the dependence of the phase of the impedance $Z_{PV}$ on the frequency F. Circle plots in the figures are measured values of the impedance, and solid lines are the results of fitting the expression (4). As in the case of the first analysis step illustrated in FIG. 6, in the second analysis step, it is found that the measured values are in good agreement with the results of the fitting. The values of the equivalent circuit constants obtained by the fitting were, the capacitance $C_e$ between the tab wiring and the frame=661 pF, the total inductance ($L_c$+$L_g$)=4.0 μH, and the series resistance of the ground wire $R_g$=4.9Ω. Here, $C_e$ is the only circuit constant unique to the solar cell module measured, and the other parameters ($L_c$+$L_g$) and $R_g$ are determined by a measurement system. Thus, in the second analysis step, only $C_e$ is output.

Thus, when $L_g$ of the inductor for resonance point adjustment 24 is changed during measurement of the impedance $Z_{PV}$ in the second analysis step, the resonance frequency $F_{res}$ changes according to the expression (5). Therefore, when there is a limit in the range of frequencies for measurement, by selecting the value of $L_g$ appropriately, the peak of resonance can be observed in the range of measurement frequencies. However, when the frequency for measurement is too high, a problem arises in the transmission of a signal. Therefore, it is better to set the measurement frequency at 10 MHz or lower, preferably 5 MHz or lower, and more preferably 3 MHz or lower. In the solar cell module used in the above examples, the capacitance between the tab wiring and the frame is $C_e$=661 pF, and further the parasitic inductance of the output cables can be estimated at $L_c$ to 0.8 μH. Therefore, when the value of $L_g$ is about 3 μH or higher, the resonance frequency $F_{res}$ can be suppressed to 3 MHz or lower. When the inductance $L_c$ of the output cables 14 is adequately large, or when the parasitic inductance of the ground wire 23 is adequately large, series resonance can occur without the inductor for resonance point adjustment 24. In either case, the intensity of the impedance $Z_{PV}$ changes greatly in a frequency region in the vicinity of the resonance frequency $F_{res}$, so that the expression (4) and the expression (5) can be fit to measured values in this region to accurately determine the value of $C_e$ corresponding to the characteristics of the sealant.

In the first embodiment, a measurement method in which the measurement terminal of the impedance measuring device 16 is connected to the positive-side terminal box 13a of the solar cell module 11, and the ground of the measurement terminal of the impedance measuring device 1 is connected to the negative-side terminal box 13b has been illustrated. Conversely, the measurement terminal of the impedance measuring device 16 may be connected to the negative-side terminal box 13b of the solar cell module 11, and the ground of the measurement terminal of the impedance measuring device 16 may be connected to the positive-side terminal box 13a, which provides the same results and effects.

Next, the results of analyzing the solar cell module using the diagnostic circuit and the diagnostic method for a solar cell module illustrated in the first embodiment will be described. Here, a single solar cell module was installed outdoor, and the results of evaluating a change in the condition of the module are described as an example.

In the process of diagnosing the solar cell module, according to the flowchart in FIG. 2, $C_d$, $R_{sh}$, L, and $R_s$ were determined in the first analysis step, and $C_e$ was determined in the second analysis step, and these were recorded. In the impedance measurement of the solar cell module, measurement was performed during the nighttime using the diagnostic circuit illustrated in FIG. 1. A network analyzer was used for the impedance measuring device 16. From the results of the impedance measurement obtained, equivalent circuit constants $C_d$, $R_{sh}$, L, $R_s$, and $C_e$ of the solar cell module were determined by the equivalent circuit analysis method described with FIGS. 6 and 7. Outdoor exposure evaluation was performed for 168 days, and variations of the equivalent circuit constants during that period were recorded.

Figure 8:
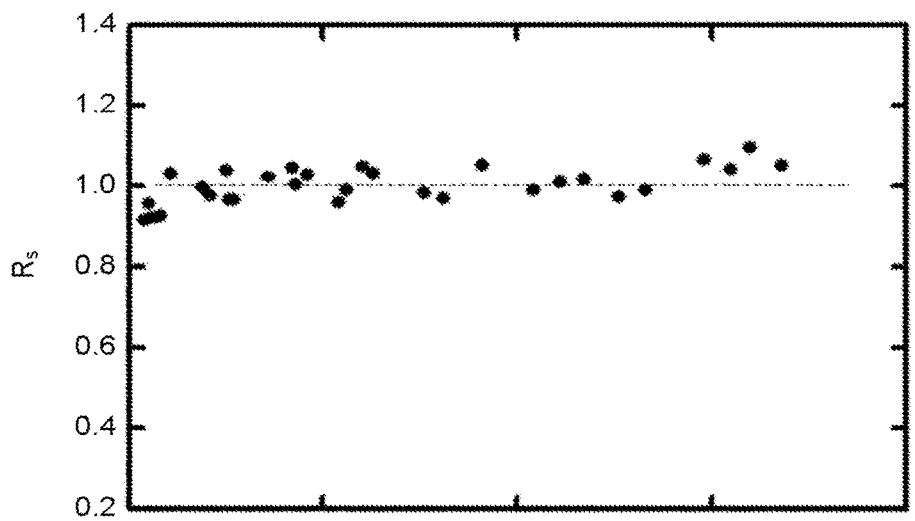
FIG. 8 is a graph illustrating an example of change over time of $R_s$ and $C_e$ of equivalent circuit constants during a period of outdoor exposure of the solar cell module measured by the method for diagnosing a solar cell module according to the first embodiment of this invention.
Figure 8:
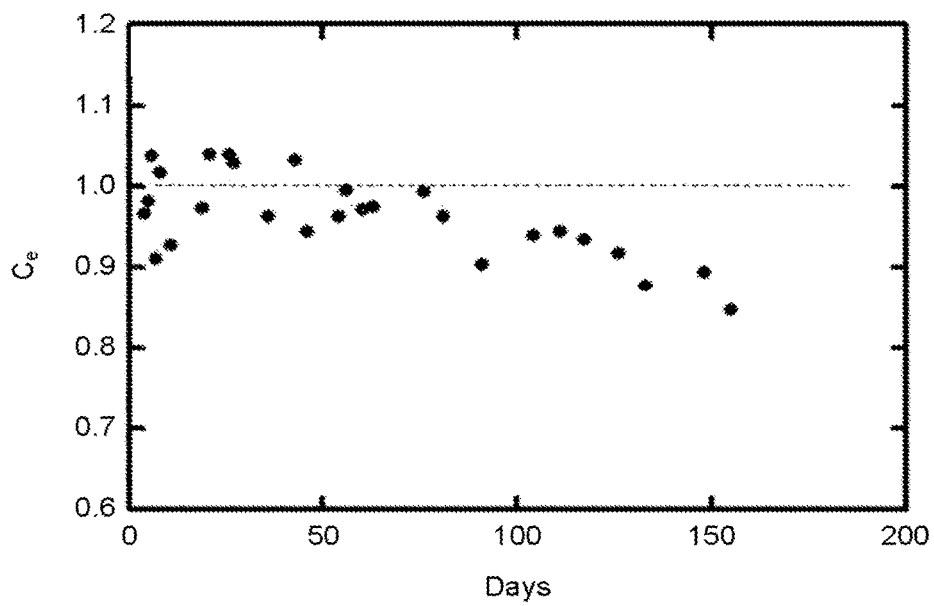

FIG. 8 is a graph illustrating an example of change over time of equivalent circuit constants $R_s$, and $C_e$ during the outdoor exposure period of the solar cell module measured by the method for diagnosing a solar cell module according to the first embodiment. FIG. 8(a) illustrates change over time of the series resistance $R_s$, of the solar cell module, as an example, of the equivalent circuit constants of the solar cell module, and FIG. 8(b) illustrates change over time of the capacitance $C_e$ between the tab wiring and the metal frame 12. Here, the values of $R_s$ and $C_e$ are normalized by initial values before the outdoor exposure. These initial values are used as values when the solar cell module is normal. That is, $R_s$ and $C_e$ go in the figures are normalized by their respective initial values, that is, values when the solar cell module 11 is normal, and thus the values correspond to the results of comparison with the values when the solar cell module 11 is normal, and are values quantitatively indicating the degree of degradation.

As illustrated in FIG. 8(a), the series resistance $R_s$, hardly changes by the outdoor exposure for 168 days. However, as for the capacitance $C_e$ between the tab wiring and the metal frame 12 in FIG. 8(b), the value of $C_e$ gradually decreases when the number of exposing days exceeds 60 days, and after 166 days, has reduced by about 15% compared to the initial value. On the other circuit constants $C_d$, $R_{sh}$, and L of the solar cell module, which are not illustrated herein, no clear change was found as in $R_s$ in FIG. 8(a). Thus, in the exposure test for a relatively short period of 168 days, it was found that the characteristics of the solar cells, and the resistance of the wiring or electrode portions of the module hardly changed, but a slight change had already occurred in the sealant used for sealing the module.

A decrease in the capacitance $C_e$ between the tab wiring and the frame corresponds to a reduction in the dielectric constant of the sealant. Thus it is considered that some change occurred in the molecular structure of the sealing material due to ultraviolet radiation to which it was subjected or moisture entering from the module edge during outdoor installation, resulting in a change in the material characteristics. It is considered that when this change proceeds further, the optical transmittance or the water barrier property of the sealant degrades, affecting the power generation characteristics of the solar cell module. Further, it is known that the degradation of the sealant causes acetic acid or the like to occur in the module, resulting in a reduction in the output of the module due to corrosion of wiring or an electrode.

Conventional diagnostic circuits and diagnostic methods for solar cell modules (e.g. see Patent Literature 1) cannot obtain the capacitance $C_e$ between the tab wiring and the metal frame 12 corresponding to the sealant of the solar cell module. The diagnostic circuit and the diagnostic method in the first embodiment can detect the condition of the sealing material in addition to the degradation of the solar cell module and the resistance failure of the electrodes or wiring portions of the module, allowing a comprehensive diagnosis of the solar cell module. This allows a user to be urged to repair or replace the solar ell module with appropriate timing before it fails, and allows the solar cell module to be repaired or replaced before a serious failure occurs, and thus has an effect that the maintenance of the entire solar cell system including a plurality of solar cell modules can be performed efficiently.

Further, by providing the first switch 22a and the second switch 22b in the junction box 15, thereby obtaining the large self-inductance $L_g$ to increase the total inductance $L_c$ the resonance frequency can be kept low to about 100 kHz to 2 MHz. The use of the relatively low-frequency resonance eliminates the need to use a measurement device excellent in frequency characteristics exceeding 2 MHz, and can reduce the cost of the diagnostic circuit. Furthermore, the provision of the first switch 22a and the second switch 22b simplifies an equivalent circuit to be analyzed, so that the accuracy of calculation is increased to accurately determine the value of the junction capacitance $C_d$.

Second Embodiment

Next, a diagnostic circuit and a diagnostic method for a solar cell module according to a second embodiment will be described. Hereinafter, differences from the first embodiment are manly described.

In the first embodiment, as illustrated in the flowchart in FIG. 2, the first switch 22a and the second switch 22b in the junction box 15 in FIG. 1 are switched to perform impedance measurement on the solar cell module 11 twice in total. Therefore, under an outdoor actual environment in which the solar cell module 11 and the junction box 15 are installed, long-term use can cause a junction failure to occur at the first switch 22a or the second switch 22b, cause a switch to fail, or cause a controller of the switches to fail, thereby causing the diagnostic circuit for the solar cell module 11 to fail.

Figure 9:
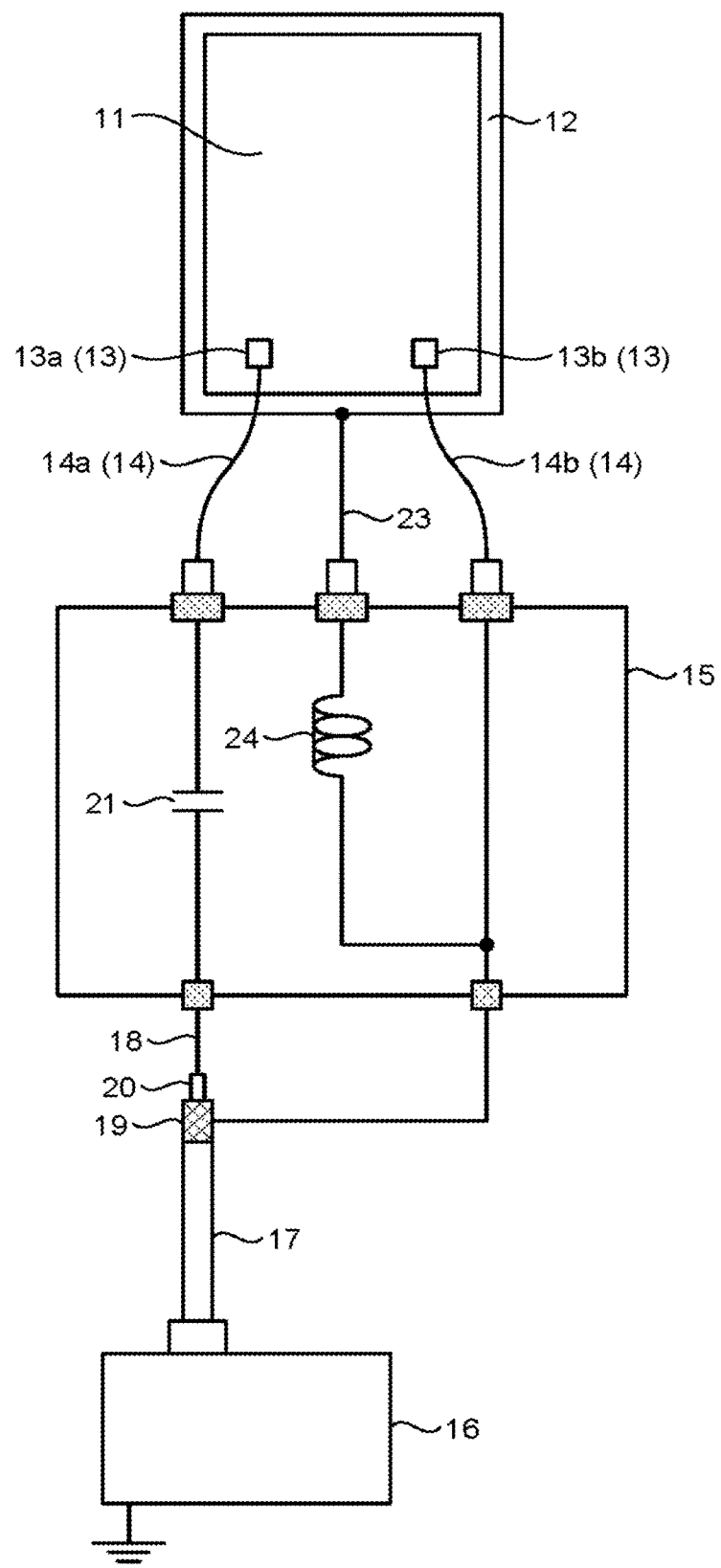
FIG. 9 is a schematic configuration diagram schematically illustrating a diagnostic circuit used for diagnosing a solar cell module according to a second embodiment of this invention.
Figure 10:
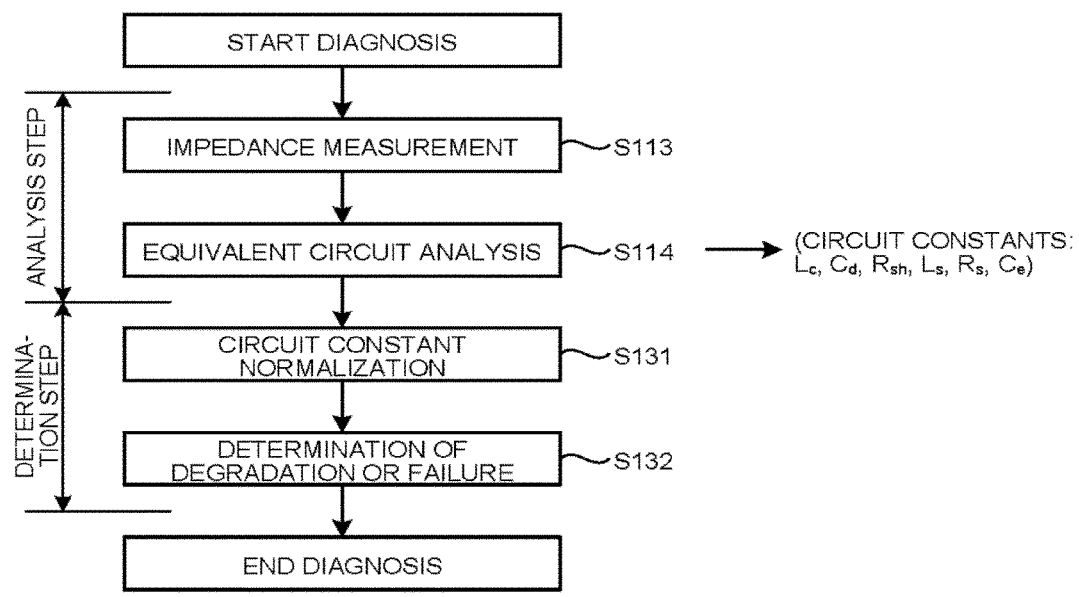
FIG. 10 is a flowchart illustrating an example of a process of diagnosing a solar cell module according to the second embodiment of this invention.

FIG. 9 is a schematic configuration diagram schematically illustrating the diagnostic circuit for a solar cell module according to the second embodiment. Compared to FIG. 1, inside parts of a junction box 15 are different in that they are directly connected without switches. An output terminal of a negative-side terminal box 13b is electrically connected to a ground of a measurement terminal of an impedance measuring device 16. A metal frame 12 is also connected to the ground of the measurement terminal of the impedance measuring device 16. This is the same state as that where the first switch 22a and the second switch 22b in FIG. 1 are both fixed on. FIG. 10 is a flowchart illustrating an example of a process of diagnosing a solar cell module according to the second embodiment. In a diagnosis, the measurement of the impedance of a solar cell module 11 (S113) and a subsequent equivalent circuit analysis (S114), which constitute an analysis step, are performed. Next, circuit constant normalization (S131) and determination of degradation or failure (S132), which constitute a determination step, are performed.

Thus, impedance measurement is performed with wiring in the junction box 15 directly connected without switches, in the same state as that where the first switch 22a and the second switch 22b in FIG. 1 are both fixed on, so that degradation or failure of these switches does not occur, and the long-term reliability of the above-described diagnostic device is significantly improved.

In the second embodiment, when impedance measurement and equivalent circuit analysis on the solar cell module 11 are performed, as illustrated in the equivalent circuit in FIG. 5, in addition to the inductance $L_c$ of output cables 14, the junction capacitance $C_d$ and the insulation resistance $R_{sh}$ of solar cells, which constitute the impedance of the module body, the inductance $L_s$ of wiring, and the series resistance $R_s$ of electrodes and wiring portions, capacitance $C_e$ between tab wiring in the module and the metal frame 12, the series resistance $R_g$ of a ground wire 23 that connects the metal frame 12 and the junction box 15, and the impedance of a branch circuit made of the self-inductance $L_g$ of an inductor for resonance point adjustment 24 needs to be considered simultaneously.

Figure 11:
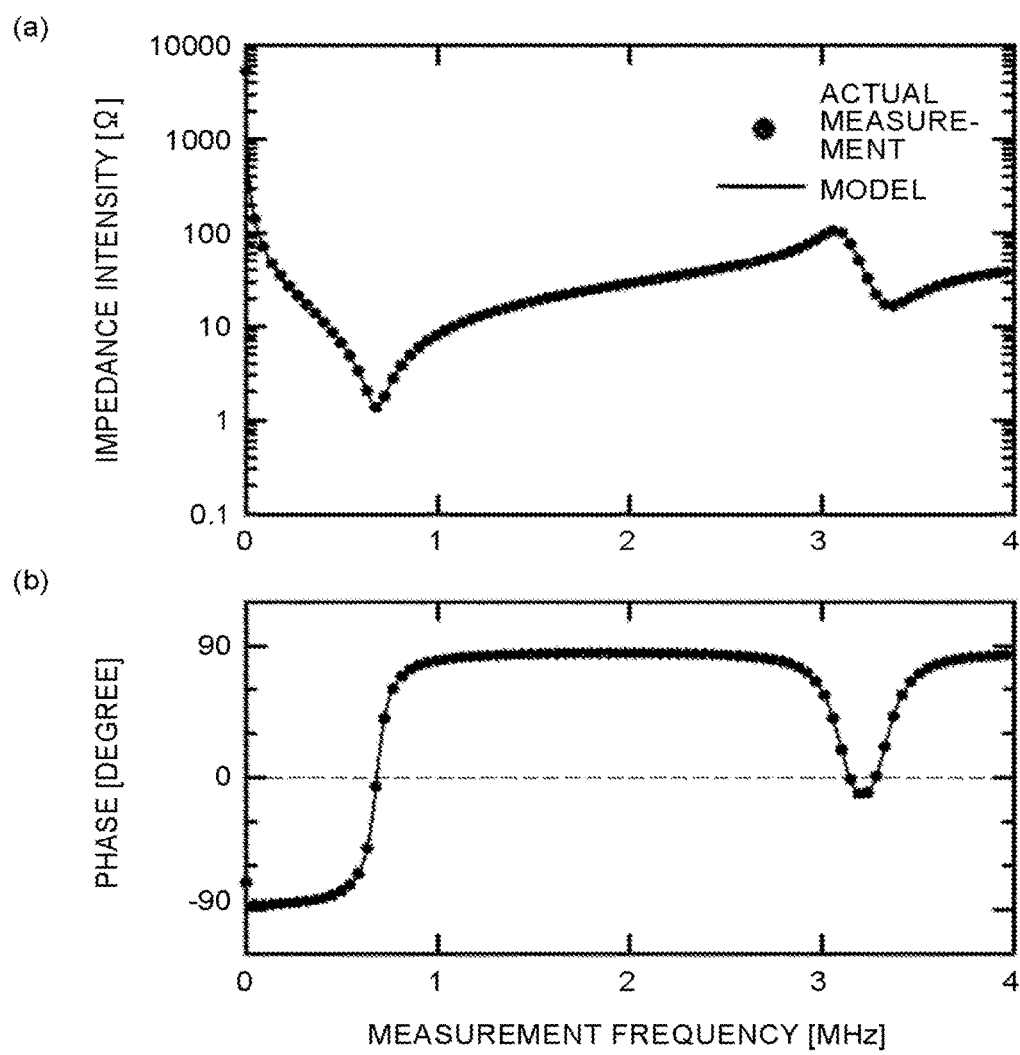
FIG. 11 is a graph illustrating an example of the frequency characteristics of the intensity and the phase of the impedance of the solar cell module, obtained by a method for diagnosing a solar cell module according to the second embodiment of this invention.

FIG. 11 is a graph illustrating an example of the results of measuring impedance $Z_{PV}$, the total impedance of the solar cell module 11. FIG. 11(a) shows the dependence of the intensity of the impedance $Z_{PV}$ of the solar cell module 11 on frequency F, and FIG. 11(b) shows the dependence of the phase of the impedance $Z_{PV}$ on the frequency F. FIG. 11 is the results of measuring the impedance $Z_{PV}$ of the solar cell module 11 while increasing the frequency F from $F_1$ to $F_2$ with the lower limit frequency set at $F_1=1$ kHz and the upper limit frequency at $F_2=4.8$ MHz, for example, when the measurement was performed at night when the solar cell module 11 does not generate power.

Like the measurement results in FIG. 3, a first resonance peak due to $L_c$ of the output cables 14 and $L_s$ and the junction capacitance $C_d$ of the module body is found at frequency of $F=0.68$ MHz. In addition, a second resonance peak newly appears in the vicinity of a frequency of $F=3$ MHz. The second resonance peak is considered to be due to parallel resonance caused by the inductance $L_c+L_s$ of the output cables 14 and the tab wiring and the capacitance $C_e$ between the metal frame 12, and series resonance caused by the inductance $L_g$ of the ground wire 23 and the capacitance $C_e$ between the tab wiring and the metal frame 12.

As described in detail with the measurement results illustrated in FIG. 3, by calculating the total impedance of the equivalent circuit, and fitting an impedance curve obtained to measured values, circuit constants $L_C$, $C_d$, $R_{sh}$, $L_s$, $R_s$, and $C_e$ can be determine at once. In the vicinities of the first resonance peak (F=0.60 MHz) and the second resonance peak (F to 3 MHz), the impedance changes sharply. Thus, by performing fitting in the entire frequency region including these two regions, the circuit constants can be accurately determined. The results of actual fitting are illustrated in FIG. 11, which shows that the measured values are in good agreement with the results of the fitting.

As above, in the second embodiment, the absence of mechanical or electrical switches for switching between measurements in the diagnostic circuit allows an improvement in the long-term reliability of the diagnostic circuit for a solar cell module. Further, when the solar cell module 11 is diagnosed, the impedance measurement (S113) and the equivalent circuit analysis (S114) each need to be performed only once, thus providing an advantage that diagnosis time is shortened.

Figure 7:
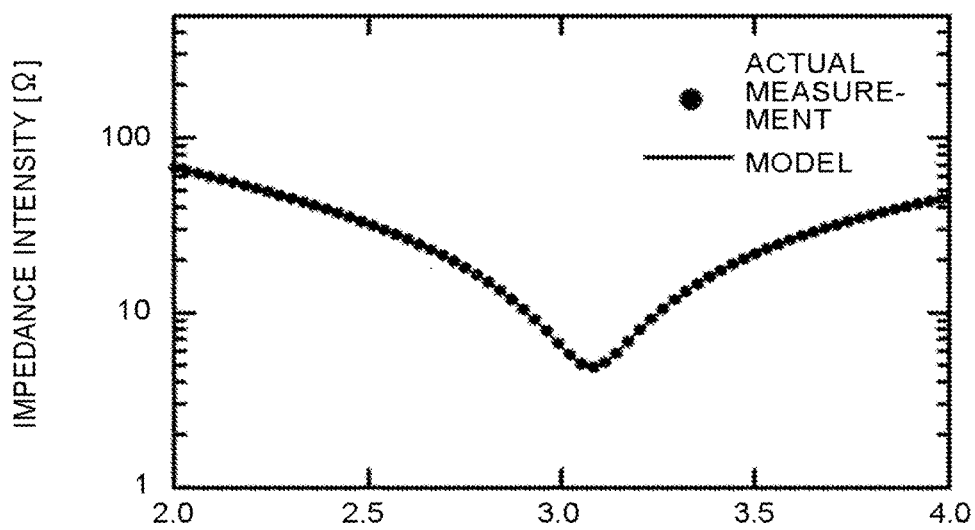
FIG. 7 is a graph illustrating an example of the frequency characteristics of the intensity and the phase of the impedance of the solar cell module, obtained by the method for diagnosing a solar cell module according to the first embodiment of this invention.
Figure 7:
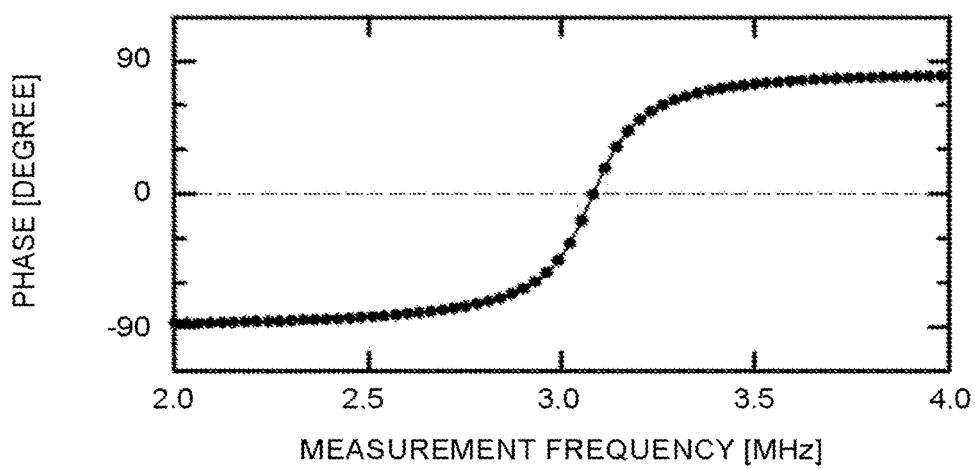
Figure 12:
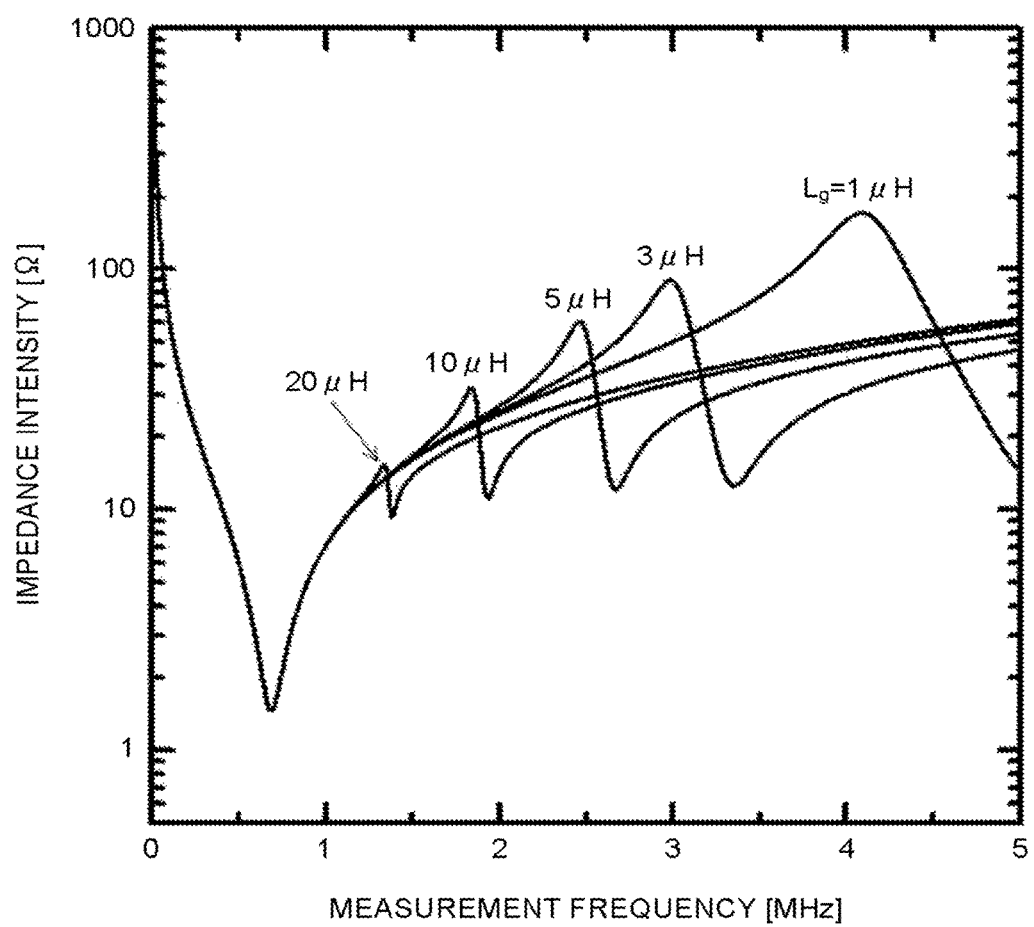
FIG. 12 is a graph illustrating an example of the frequency characteristics of the impedance intensity of the go solar cell module calculated with the self-inductance $L_g$ of an inductor for resonance point adjustment as a parameter in the method for diagnosing a solar cell module according to the second embodiment of this invention.

In the method for diagnosing the measurement results illustrated in FIG. 7 in the first embodiment, by increasing $L_g$ of the inductor for resonance point adjustment 24, the resonant peak can be shifted to the low-frequency side without limitation. However, in the diagnostic method in the second embodiment, when the value of $L_g$ is increased, the impedance of the branch circuit including $C_e$, $L_g$, and $R_g$ is increased, and current of a high-frequency signal hardly flows through the circuit. Thus, the value of $L_g$ of the inductor for resonance point adjustment 24 has an appropriate numerical range. FIG. 12 is a graph illustrating the results of determining the total impedance $Z_{PV}$ of the solar cell module by a simulation with the value of $L_g$ as a parameter. Here, for the circuit constants other than $L_g$, values obtained by a diagnosis were used. Specifically, they were set at $L_c=0.8$ µH, $C_d=25.4$ nF, $R_{sh}=12.1$ kΩ, $L_s=1.3$ µH, $R_s=1.5$ Ω, $C_e=661$ pF, and $R_g=4.9$ Ω. The value of $L_g$ was changed in a range of 1 to 20 µH. When the value of $L_g$ is increased from 1 to 20 µH, the frequency of the second resonance peak is greatly reduced from 4 MHz to 1.4 MHz. However, it is found that the amount of change in impedance at the resonance point is significantly reduced simultaneously. When the amount of change in impedance becomes small, the accuracy of curve fitting is greatly degraded. Thus, in order to provide an adequate amount of change in impedance at the resonance point, as illustrated in FIG. 12, it is necessary to set the value of $L_g$ at 20 µH or lower. For the resonance point to appear in a low-frequency region of 3 MHz and lower, the value of $L_g$ may be set at 3 µH or higher, and consequently, may be set in a range of 3 µH<$L_g$<20 µH.

Using the diagnostic circuit and the diagnostic method in the second embodiment, the condition of the sealing material can be detected in addition to the degradation of the solar cells and resistance failure of the electrodes or the wiring portions of the module, and the solar cell module can be comprehensively diagnosed.

Third Embodiment

Figure 13:
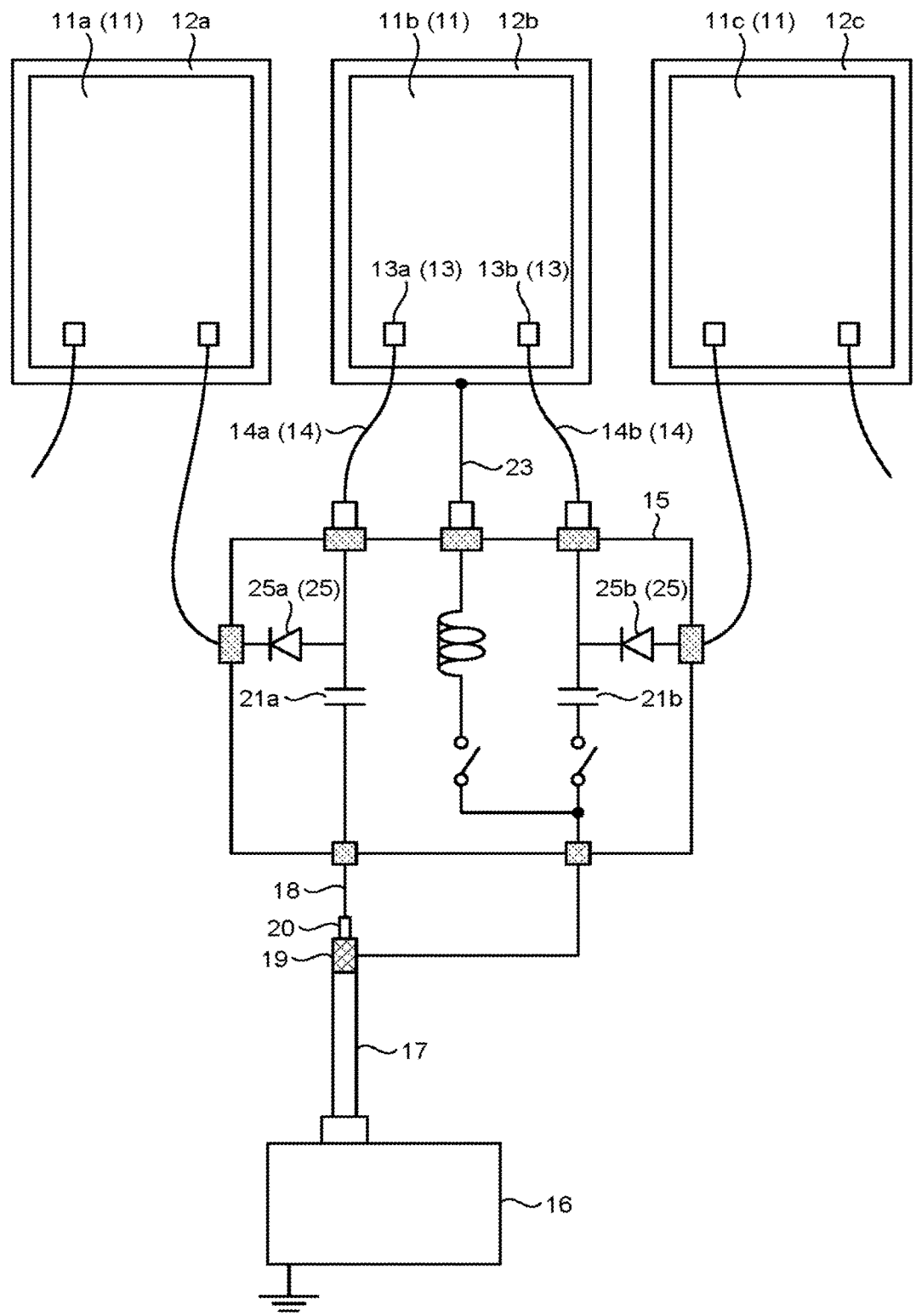
FIG. 13 is a schematic configuration diagram schematically illustrating a diagnostic circuit used for diagnosing a solar cell module according to a third embodiment of this invention.

FIG. 13 is a schematic configuration diagram schematically illustrating a diagnostic circuit used for diagnosing a solar cell module according to a third embodiment. Hereinafter, differences from the first embodiment are mainly described. In the third embodiment, a method for diagnosing a specific solar cell module in a solar cell string in which a plurality of solar cell modules 11a, 11b, and 11c are connected in series is described. In the following description, the plurality of solar cell modules 11a, 11b, and 11c is sometimes collectively referred to as solar cell modules 11. As in the first embodiment, a terminal of a positive-side terminal box 13a, one output terminal of terminal boxes 13 of the solar cell module 11b to be measured, is connected to a central conductor 18 of a coaxial cable 17 connected to a measurement terminal of an impedance measuring device 16, via an output cable 14a and a junction box 15. In the middle of this path, that is, in the junction box 15, a blocking capacitor 21a for blocking DC is interposed.

On the other hand, a terminal of a negative-side terminal box 13b, the other output terminal of the terminal boxes 13 of the solar cell module 11b, is connected to an external conductor 19 of the coaxial cable 17 and a ground of the impedance measuring device 16 via an output cable 14b and the junction box 15. In this path also, a blocking capacitor 21b for blocking DC is interposed in the junction box 15.

A high-frequency signal for measurement provided from the impedance measuring device 16 to the solar cell module bib has an adequately high frequency, in other words, the capacitance of the capacitor is adequately large, so that it easily passes through the blocking capacitor 21a and can propagate to the solar cell module 11b. DC voltage and current generated in the solar cell module 11b are blocked by the blocking capacitors 21a and 21b. As a result, the impedance measuring device 16 can be prevented from failing due to an overvoltage generated in the solar cell module 11b. The external conductor 19 on the return side of the coaxial cable 17 and a metal frame 12b of the solar cell module 11b are also electrically separated by the blocking capacitor 21b, so that a casing of the impedance measuring device 16 can be grounded to prevent an electric shock. The metal frame 12b of the solar cell module 11b can also be grounded via a ground wire 23.

As illustrated in FIG. 13, diodes 25a and 25b for interference prevention (hereinafter, diodes 25 when referred to collectively) are interposed at connections between the adjacent solar cell modules 11a, 11b, and 11c in the string for each module. During the nighttime when impedance is measured, the solar cell modules 11 do not generate power, so that no voltage is generated across the diodes 25, and the diodes 25 are in an off state. Therefore, a high-frequency signal provided from the measurement terminal of the impedance measuring device 16 to the specific solar cell module 11b cannot propagate to the other solar cell modules 11a and 11c adjacent to the solar cell module 11b. As a result, impedance measurement only on the solar cell module 11b to be measured is possible. On the other hand, during the daytime when the solar cell modules 11 generate power, voltage is generated across the diodes 25, so that the diodes 25 are in an on state, and the solar cell modules 11a, 11b, and 11c in the string are all in an electrically connected state. If impedance measurement of the solar cell module 11b is performed in this state, the measurement is subject to influence other than that of the module being measured, particularly the influence of the solar cell module 11a and the solar cell module 11c on both sides, and becomes difficult.

As above, in the third embodiment, the interference prevention diodes 25 are interposed between the adjacent modules in the solar cell string in which the plurality of solar cell modules 11 are connected in series. Thus, during the nighttime when impedance measurement is performed, these diodes 25 are in the off state, and the modules are electrically separated. This can prevent interference from the other solar cell modules during impedance measurement of one solar cell module 11. During power generation in the daytime, the diodes 25 are in the on state, and thus do not have any adverse effect on power transmission.

In the third embodiment, the junction box 15 is connected only to the solar cell module 11b to be measured. Alternatively, the junction box 15 may be connected in advance also to each of the other solar cell modules ha and ho, and the impedance measuring device 16 and the junction box 15 may be connected at the time of measurement. In this case, it is only necessary to prepare one interference prevention diode 25 in each junction box, and one diode is interposed between adjacent solar cell modules.

Using the diagnostic circuit and the diagnostic method in the third embodiment, the condition of a sealing material can be detected in addition to the degradation of a specific solar cell in a solar cell string in which a plurality of solar cell modules are connected in series, and resistance failure of electrodes or wiring portions of the module, and the solar cell module can be comprehensively diagnosed.

Fourth Embodiment

Next, a system for diagnosing solar cell modules according to a fourth embodiment will be described. Hereinafter, differences from the first and third embodiments are mainly described.

Figure 14:
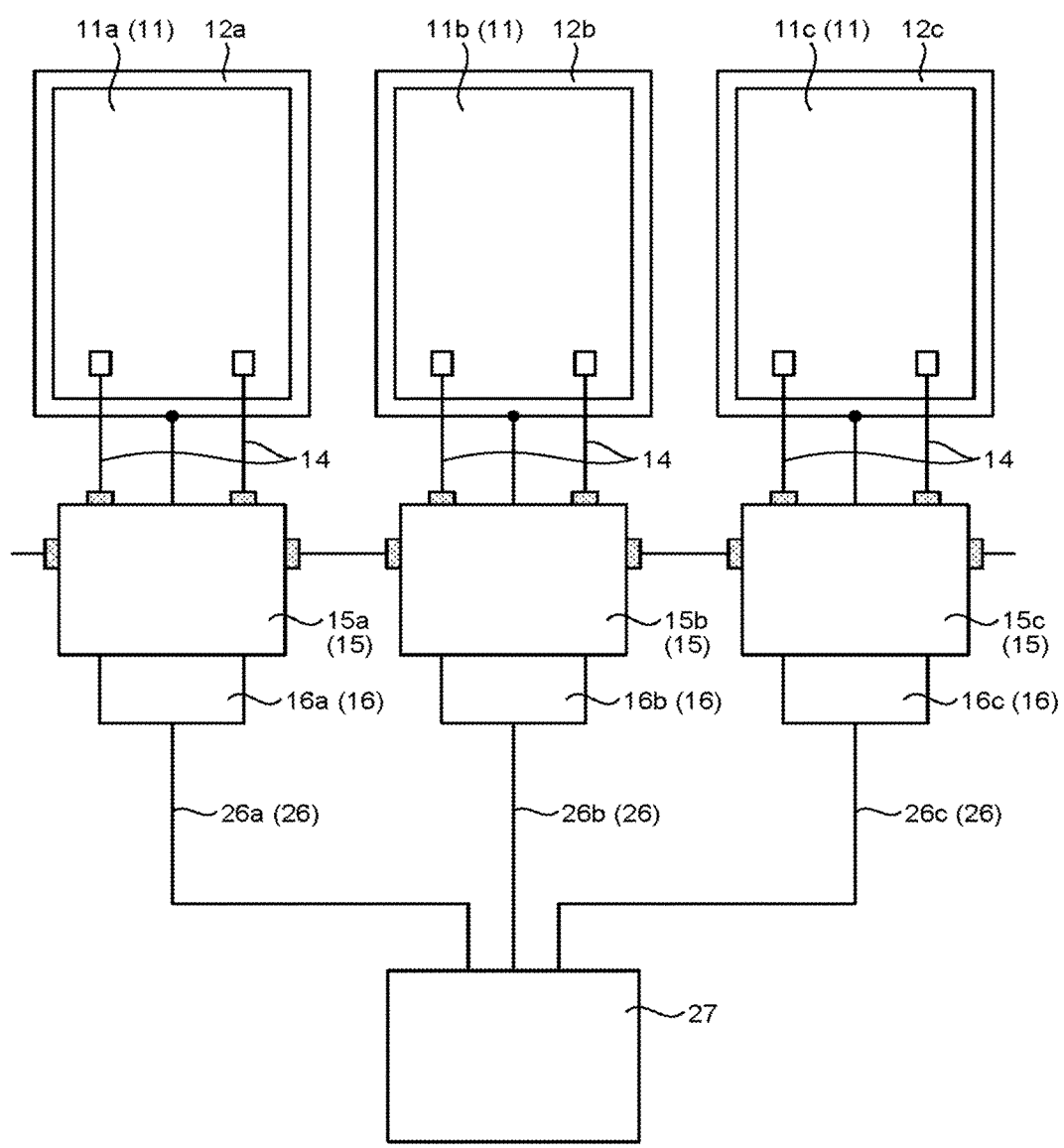
FIG. 14 is a schematic configuration diagram schematically illustrating a diagnostic system used for diagnosing solar cell modules according to a fourth embodiment of this invention.

In the fourth embodiment, a solar cell module diagnostic system that continuously diagnoses individual solar cell modules constituting a photovoltaic power system will be described with reference to FIG. 14. FIG. 14 is a schematic configuration diagram schematically illustrating the diagnostic system used for diagnosing solar cell modules according to the fourth embodiment. For all solar cell modules 11, junction boxes 15a, 15b, and 15c described in the third embodiment (hereinafter, junction boxes 15 when referred to collectively) and impedance measuring devises 16a, 16b, and 16c (hereinafter, impedance measuring devices 16 when referred to collectively) are installed. As in the third embodiment, output cables 14 of a solar cell module 11b are connected in series to output cables 14 of solar cell modules 11a and 11c on both sides via the junction box 15b. In FIG. 14, the interior of the junction boxes 15 is not illustrated. The impedance measuring devices 16 are directly connected to the junction boxes 15. A host computer 27 constituting a controller is connected to the impedance measuring devices 16 via communication units 26a, 26b, and 26c (hereinafter, communication units 26 when referred to collectively). The impedance measuring devices 16 transmit impedance information on the solar cell modules 11 to the host computer 27 via the communication units 26, and receive a command on measurement from the host computer 27. The impedance measuring devices 16 and the host computer 27 have an interface for communication via the communication units 26. The host computer 27 also has a unit for communicating with the junction boxes 15. Further, the impedance measuring devices 16 may have a unit for communicating with the junction boxes 15. The host computer 27 can control on or off of first switches 22a and second switches 22b in all the junction boxes 15 via the communication units 26. Here, it is needless to say that the communication units 26 do not necessarily need to be wired, and may be wireless. In the fourth embodiment, each junction box 15 and each impedance measuring device 16 are separate casings. Alternatively, these may be contained together in a single casing. The host computer 27 extracts equivalent circuit constants of each solar cell module 11 from impedance frequency dependence data obtained, and detects the presence or absence of a failure or the degree of degradation of the solar cell module 11 by comparison with reference values.

The diagnostic system for solar cell modules as described above can successively perform impedance measurement of the solar cell modules 11 in the solar cell string or the entire photovoltaic power system by the host computer 27 controlling the impedance measuring devices 16 and the junction boxes 15 via the communication units 26. Since nighttime without sunlight is preferable for impedance measurement, using a clock built in the host computer 27, measurement can be automatically started in each module at sundown, for example, to determine the presence or absence of occurrence of a malfunction. When a solar cell module in which a malfunction has occurred is detected, by immediately performing necessary maintenance such as the replacement of the solar cell module 11 or the repair of the output terminal box, the photovoltaic power system can be operated so that the amount of power generation in the daytime is not reduced.

Fifth Embodiment

Next, a system for diagnosing solar cell modules according to a fifth embodiment will be described. Hereinafter, differences from the fourth embodiment are mainly described.

In the fifth embodiment, a diagnostic system with higher accuracy that acquires temperature information simultaneously in addition to impedance information on solar cell modules when continuously diagnosing individual solar cell modules that constitute a photovoltaic power system, to correct the results of diagnosis of the solar cell modules based on the temperature information is described. An equivalent circuit of the solar cell modules has already been illustrated in FIG. 5, in which the values of the junction capacitance $C_d$, the parasitic capacitance $C_e$, the series resistance $R_s$, and the insulation resistance $R_{sh}$ also depend on the temperature of the solar cell module. Thus, even if there is no degradation in the solar cell module itself, different temperatures cause changes in these values. Therefore, in order to detect the degradation state of the solar cell module with high accuracy, it is necessary to acquire temperature information simultaneously as well as impedance information on the solar cell module to correct the results of diagnosis appropriately with difference in temperature taken into consideration.

Figure 15:
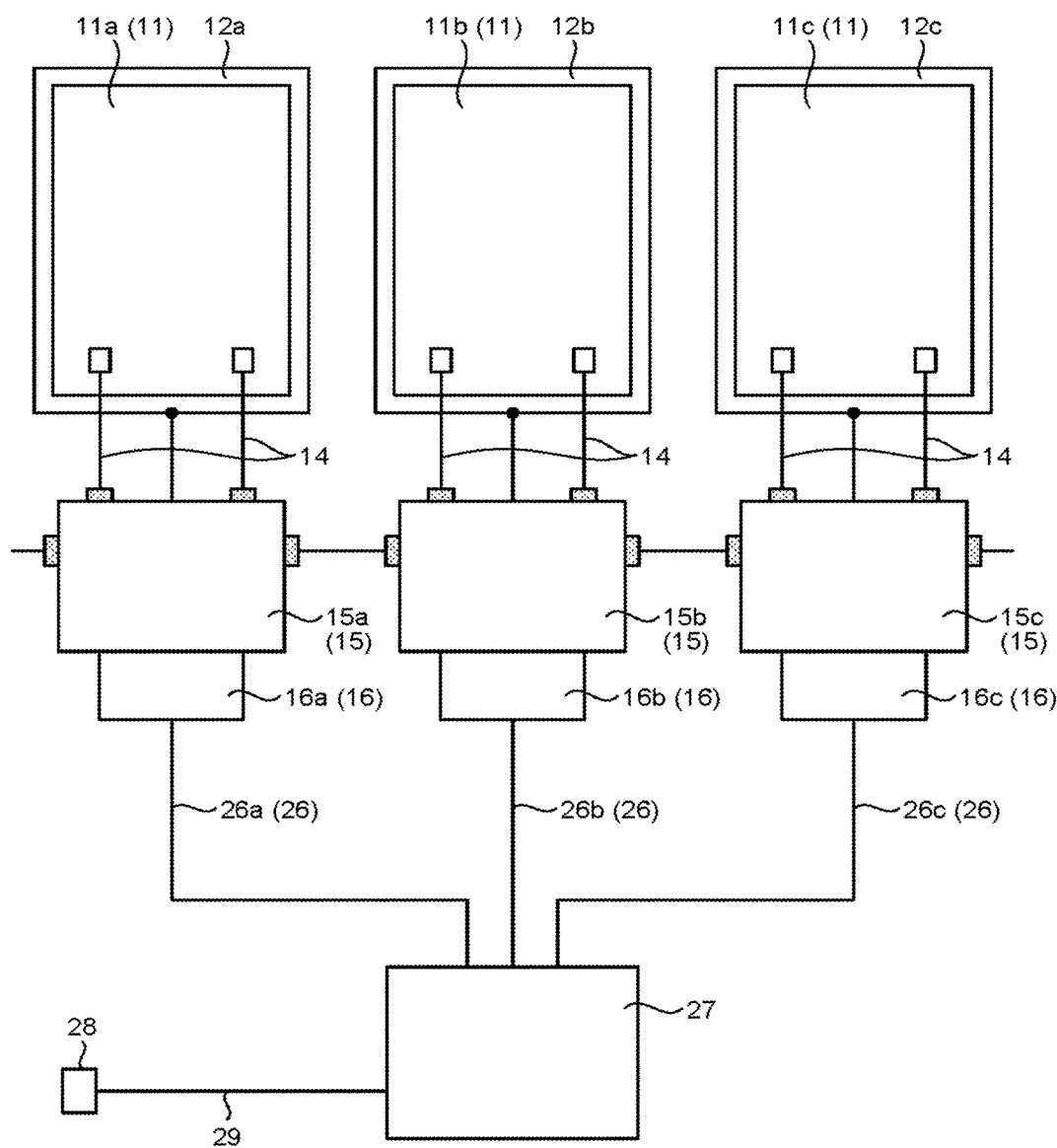
FIG. 15 is a schematic configuration diagram schematically illustrating a diagnostic circuit used for diagnosing solar cell modules according to a fifth embodiment of this invention.

FIG. 15 is a schematic configuration diagram schematically illustrating a diagnostic circuit used for diagnosing solar cell modules according to the fifth embodiment. In FIG. 15, a thermometer 28, a temperature measurement unit, is added to FIG. 14. The thermometer is connected to a host computer 27 via a communication unit 29. In order to perform temperature correction in the diagnosis of solar cell modules 11, it is necessary to grasp the temperature of the solar cell modules 11 when the impedance of the solar cell modules 11 is measured. However, since a module diagnosis in the fifth embodiment is also usually performed at night as already described, there is no heat input by sunlight and self-heating by power generation during diagnosis. It can be considered that the temperature of the solar cell modules 11 nearly agrees with the outside air temperature. Therefore, in the fifth embodiment, in place of measuring the temperature of the solar cell modules 11 in a photovoltaic power system, the thermometer 28 to measure the outside air temperature is installed in the diagnostic system. When the thermometer 26 can actually measure the temperature of the solar cell modules 11, such a configuration may be used. In either case, the thermometer 28 can obtain temperature information that can be regarded as the temperature of the solar cell modules 11. The thermometer 26 transmits temperature information obtained to the host computer 27 via the communication unit 29, and receives a command on measurement from the host computer 27. The thermometer 28 has an interface for a temperature sensor to communicate via the communication unit 29.

The diagnostic system for solar cell modules according to the fifth embodiment allows temperature correction to be performed on diagnostic results, using impedance information on the solar cell modules 11 and atmospheric temperature information constituting an index of the module temperature collected in the host computer 27. An example of a module diagnosis in which temperature correction is performed will be described with reference to FIGS. 16 and 17.

Figure 16:
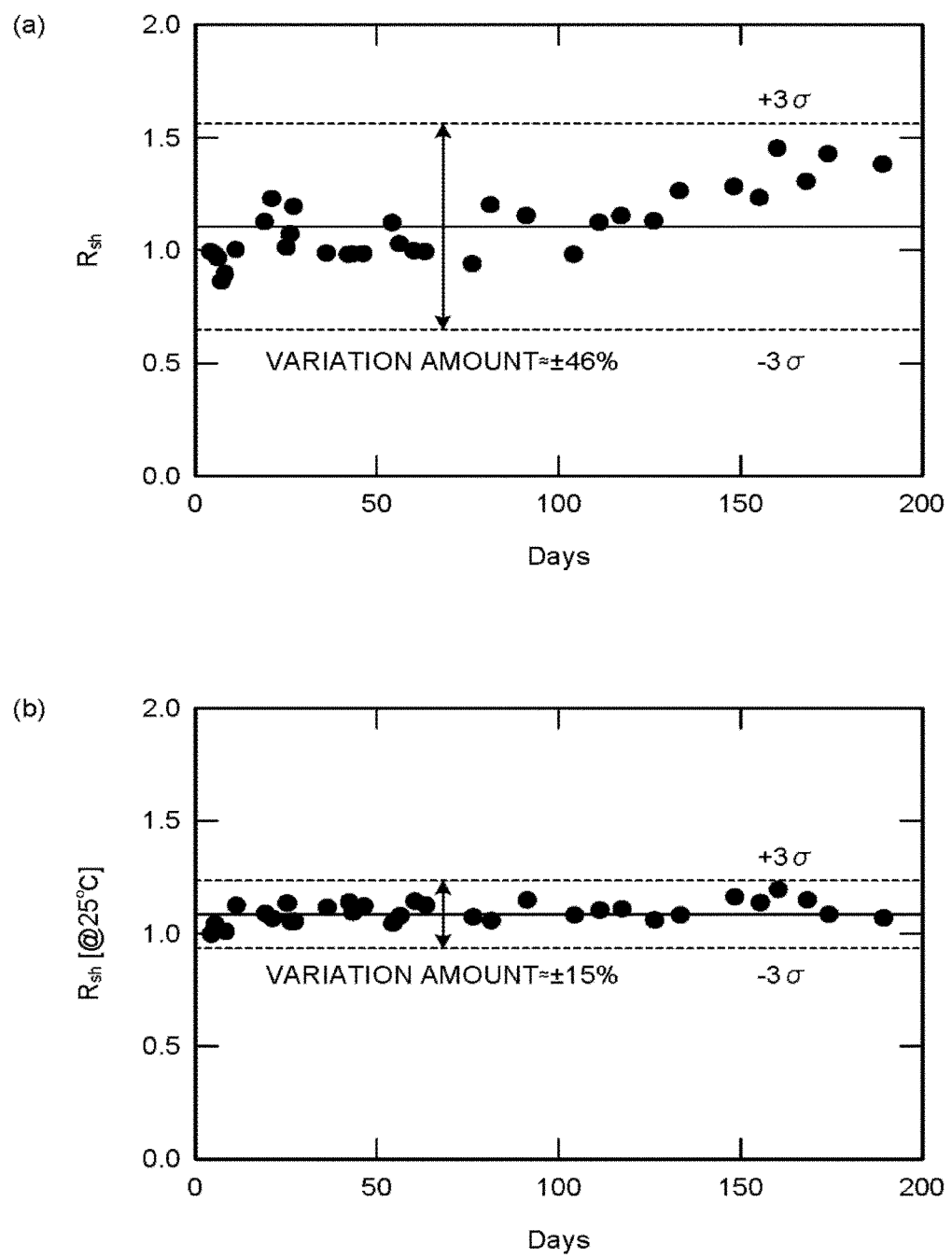
FIG. 16 is a graph illustrating an example of change over time of insulation resistance $R_{sh}$ of an equivalent circuit constant during a period of outdoor exposure of a solar cell module measured by a method for diagnosing a solar cell module according to the fifth embodiment of this invention.

FIG. 16 is a graph illustrating an example of change over time of insulation resistance $R_{sh}$ of an equivalent circuit constant during an outdoor exposure period of a solar cell module, measured by a method for diagnosing solar cell modules according to the fifth embodiment. FIG. 16(a) is a graph illustrating diagnostic results when temperature correction is not performed, and FIG. 16(b) is a graph illustrating diagnostic results when temperature correction is performed. FIG. 16 is diagnostic results extracted during a relatively short exposure period of six months or less. FIG. 16(a) is a graph illustrating diagnostic results when temperature correction is not preformed, described in the first embodiment and the second embodiment. Here, a method for measuring the impedance of the solar cell module 11 and a method for extracting circuit constants from impedance frequency characteristics are the same as those in the first embodiment and the second embodiment, and will not be described. The value of the insulation resistance $R_{sh}$ in the graph is normalized by an initial value before outdoor exposure, and corresponds to a result of comparison with a value when the solar cell module 11 is normal, and is a value quantitatively indicating the degree of degradation in insulation of the solar cell module 11.

In the outdoor exposure test of the solar cell modules, the exposure period is relatively short, 189 days at the longest, that is, about six months. The performance guarantee period of the solar cell modules is ten years or longer. Thus it is considered that outdoor exposure to this extent does not cause any degradation in the solar cell modules. In actuality, characteristic evaluation was performed by a solar simulator on a solar cell module after this exposure test, and no significant differences in power generation characteristics were found before and after the test. Therefore, the values of the insulation resistance $R_{sh}$ and the other circuit constants should be almost constant in this short exposure test. However, as illustrated in FIG. 16(a), when temperature correction is not performed, daily variations in the value of $R_{sh}$ extracted are considerably great. When the exposure period exceeds about 120 days, $R_{sh}$ shows a tendency to increase slightly. When the variation amount of $R_{sh}$ during the entire exposure period, that is, $\pm 3\sigma$ ($\sigma$: standard deviation) was calculated, it was found to be as much as about $\pm 46\%$. Since the diagnostic results of $R_{sh}$, an index of the insulation properties of the module, thus vary greatly, even if degradation occurs in the insulation properties of the module and the value of $R_{sh}$ decreases within a range of a variation amount of $\pm 46\%$, it is difficult to detect the degradation.

Next, diagnostic results when temperature correction is performed in the diagnosis of a solar cell module will be described. As already illustrated in FIG. 15, the atmospheric temperature at the installation place of the thermometer 26, regarded as the temperature of the solar cell modules 11 is continuously monitored by the thermometer 2E. During the exposure test, the module temperature varied daily, changing in a range of $T_m = 17°$ C. to $47°$ C. Thus, the relationship between the insulation resistance $R_{sh}$ of the solar cell module in FIG. 16(a) and the module temperature $T_m$ at the time of diagnosis was examined. The results are illustrated in FIG. 17.

Figure 17:
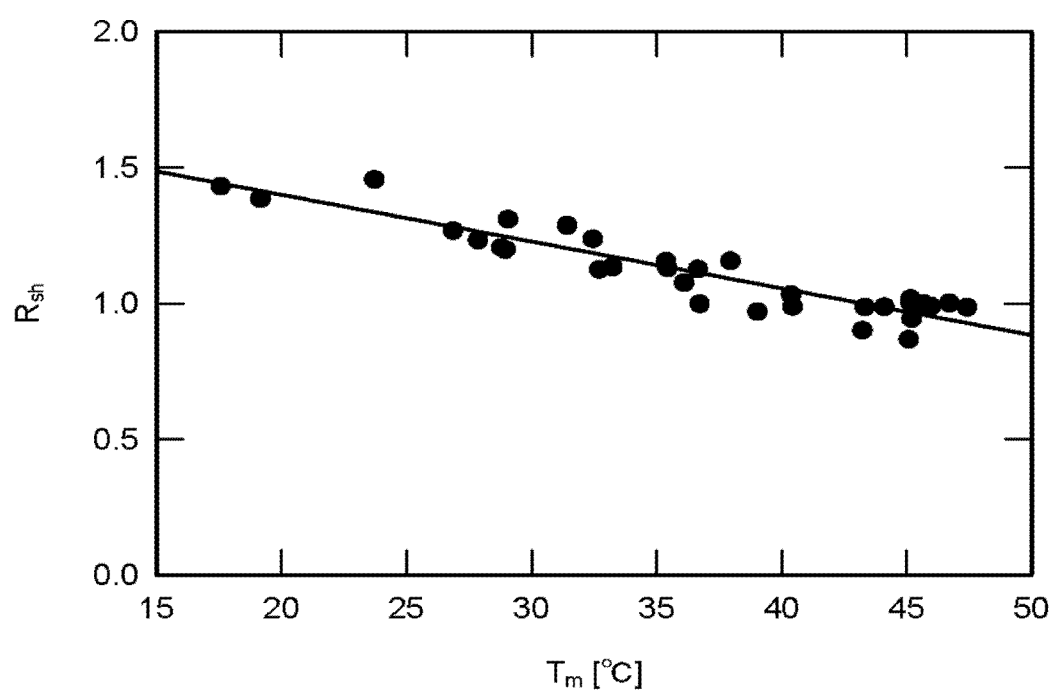
FIG. 17 is a graph illustrating a correlation between $R_{sh}$ of an equivalent circuit constant of the solar cell module and a module temperature $T_m$ measured by the method for diagnosing a solar cell module according to the fifth embodiment of this invention.

FIG. 17 is a graph illustrating the correlation between $R_{sh}$, an equivalent circuit constant of the solar cell module, measured by the method for diagnosing solar cell modules according to the fifth embodiment, and the module temperature $T_m$. As illustrated in FIG. 17, it was found that there was a strong negative correlation between them. Specifically, when the module temperature $T_m$ is low, the insulation resistance $R_{sh}$ is large, and conversely, when the module temperature $T_m$ is high, the insulation resistance $R_{sh}$ is small. When regression analysis was performed on the data of $R_{sh}$ and $T_m$, it was found that there is a relationship of $R_{sh} = -0.0171 T_m + 1.74$ at correlation coefficient $r = -0.925$, between $R_{sh}$ and $T_m$. That is, it was found that the temperature coefficient of the insulation resistance $R_{sh}$ was $\alpha$=-0.0171° C.$^{-1}$. When a regression line given by this linear expression, that is, $R_{sh}$=-0.0171$T_m$+1.74 is superimposed on FIG. 17, it is found that most plots are placed on this line in the entire temperature range of $T_m$=17° C. to 47° C. Therefore, it is concluded that differences of the module temperature at the time of diagnosis are the major cause of the daily variations in the extracted value of $R_{sh}$.

As above, it was found that the temperature of the solar cell modules installed outdoor was not constant, and the extracted equivalent circuit constants varied due to differences in temperature when the modules were diagnosed. Since it is expected that any degradation does not occur in the modules during a relatively short period, for example, a period of about several months to one year, after new or normal modules are installed outdoor, by examining the correlation between circuit constants such as $C_d$, $C_e$, $R_s$, and $R_{sh}$ extracted during this period and the module temperature $T_m$, the temperature coefficients of the circuit constants can be easily obtained. Thus, a temperature correction method in the fifth embodiment eliminates the need to measure or evaluate the temperature characteristics of a solar cell module in advance before the module is installed, and only requires collection of data during a fixed period after installation.

When the temperature coefficients of the circuit constants are found, the values of the circuit constants when the module temperature is $T_m$=25° C., for example, can be estimated. By monitoring the condition of the module using these values, influence due to difference in the module temperature at the time of diagnosis is considered to be able to be removed. Chen the values of the circuit constants when the module temperature is $T_m$=25° C. are determined, for example, for the above-described insulation resistance $R_{sh}$, since the temperature coefficient is $\alpha$=-0.0171° C.$^{-1}$, it can be determined from a relationship of $R_{sh}$ (@ 25° C.)=$R_{sh}$ (@ $T_m$)-$\alpha$($T_m$-25).

Change over time of $R_{sh}$ (@ 25° C.) on which temperature correction is thus performed actually is illustrated in BIG. 16(b), in which it is found that variations of $R_{sh}$ (@ 25° C.) are suppressed greatly compared to those in FIG. 16(a) that illustrates diagnostic results when temperature correction is not performed, and the variation amount (±3σ) during the entire exposure period is reduced to about ±15%. Thus, since the daily random variation amount of $R_{sh}$ is limited to about 15%, when the amount of change of $R_{sh}$ that occurs with the degradation of the module is 20% or more, this change can be captured. As already described, when the temperature correction is not performed, the change cannot be captured unless it is at least 50% or more. Thus it can be said that the temperature correction method in the fifth embodiment greatly increases detection accuracy.

The fifth embodiment has been described on the effects of the temperature correction by taking the module insulation resistance $R_{sh}$ as an example. On the other circuit constants, specifically, the series resistance $R_s$ of the module, the junction capacitance $C_d$ of the module, and the parasitic capacitance $C_e$ corresponding to the sealant, the same effects were obtained.

In the fifth embodiment, the atmospheric temperature in the vicinity of the place where the solar cell module 11 is installed is measured by the thermometer 26, and this is set as the module temperature $T_m$. Alternatively, a thermometer such as a thermocouple may be attached to a surface of the solar cell module 11 to directly measure $T_m$ of the module temperature. That is, without the necessity to measure or evaluate in advance the temperature characteristics of the equivalent circuit constants of the module, temperature coefficients can be determined from diagnostic results after installation.

The present invention is not limited to the above embodiments, and can be variously altered without departing from the scope in its implementation phase. The above embodiments include inventions in various phases, and by appropriately combining a plurality of structural elements disclosed, various inventions can be drawn. For example, when the problem described in the section of Technical Problem is solved, and the effects described in the section of Advantageous Effects of Invention are obtained even though some structural elements are deleted from all structural elements disclosed in the above embodiments, the configuration with the structural elements deleted can be drawn as an invention. Further, components over different embodiments may be combined appropriately.

REFERENCE SIGNS LIST 11, 11a, 11b, 11c solar cell module, 12, 12a, 12b, 12c metal frame, 13, 13a, 13b terminal box, 14, 14a, 14b output cable, 15, 15a, 15b, 15c junction box, 16, 16a, 16b, 16c impedance measuring device, 17 coaxial cable, 18 central conductor, 19 external conductor, 20 dielectric, 21, 21a, 21b blocking capacitor for blocking DC, first switch, 22b second switch, 23 ground wire, inductor for resonance point adjustment, 25, 25a, 25b interference prevention diode, 26, 26a, 26b, 26c, 29 communication unit, 27 host computer, 28 thermometer.

The invention claimed is:

1. A diagnostic method for performing diagnosis of a solar cell module having a conductive frame by measuring frequency characteristics of impedance of the solar cell module during a period of time when solar cells included in the solar cell module do not generate power, using a frequency-variable impedance measuring device connected to the solar cell module, the method comprising:

an analysis of measuring frequency characteristics including a resonance point of impedance between two output cables of the solar cell module, and frequency characteristics including a resonance point of impedance between one of the two output cables and the frame, and determining equivalent circuit constants of the solar cell module from the frequency characteristics measured; and a determination of comparing the equivalent circuit constants determined in the analysis with equivalent circuit constants obtained previously to determine change in condition of the solar cell module, wherein the analysis comprises:

measuring first frequency characteristics including a resonance point of impedance between two output cables of the solar cell module;

determining equivalent circuit constants for a first equivalent circuit based on the first frequency characteristics;

measuring second frequency characteristics including a resonance point of impedance between one of the two output cables and the frame; and determining equivalent circuit constants for a second equivalent circuit based on the second frequency characteristics.

2. The method for diagnosing a solar cell module according to claim 1, wherein the measurement of frequency characteristics including a resonance point of impedance between one of the two output cables and the frame is performed using a circuit in which an inductor for resonance point adjustment is interposed between the frame and a ground of the impedance measuring device.

3. The method for diagnosing a solar cell module according to claim 1, wherein in the analysis, temperature correction for the equivalent circuit constants is performed, using a relationship between information on the equivalent circuit constants obtained for a fixed period until degradation in the solar cell module occurs and temperature dependence of the equivalent circuit constants estimated from temperature information on the solar cell module.

4. A diagnostic method for performing diagnosis of a solar cell module having a conductive frame by measuring frequency characteristics of impedance of the solar cell module during a period of time when solar cells included in the solar cell module do not generate power, using a frequency-variable impedance measuring device connected to the solar cell module, the method comprising:
 an analysis of measuring frequency characteristics including a resonance point of impedance between two output cables of the solar cell module, using a circuit in which an inductor for resonance point adjustment is interposed between the frame and a ground of the impedance measuring device, and determining equivalent circuit constants of the solar cell module from the frequency characteristics measured; and
 a determination of comparing the equivalent circuit constants determined in the analysis with equivalent circuit constants obtained previously to determine change in condition of the solar cell module.

5. The method for diagnosing a solar cell module according to claim 4, wherein self-inductance of the inductor for resonance point adjustment is between 3 μH and 20 μH inclusive.

6. The method for diagnosing a solar cell module according to claim 4, wherein in the analysis, temperature correction for the equivalent circuit constants is performed, using a relationship between information on the equivalent circuit constants obtained for a fixed period until degradation in the solar cell module occurs and temperature dependence of the equivalent circuit constants estimated from temperature information on the solar cell module.

7. A circuit for diagnosing a solar cell module that diagnoses a solar cell module having a conductive frame, the circuit comprising:
 a blocking capacitor that is connected at one end to a first output terminal of a first solar cell module, and connected at the other end to a measurement terminal of an impedance measuring device;
 a first switch connected at one end to a second output terminal of the first solar cell module, and connected at the other end to a ground of the impedance measuring device; and
 a resonance point adjustment circuit that includes an inductor for resonance point adjustment and a second switch connected in series to the inductor for resonance point adjustment, and is connected at one end to the frame and connected at the other end to the ground of the impedance measuring device.

8. The circuit for diagnosing a solar cell module according to claim 7, wherein self-inductance of the inductor for resonance point adjustment is between 3 μH and 20 μH inclusive.

9. The circuit for diagnosing a solar cell module according to claim 7, further comprising a first interference prevention diode with an anode terminal connected to the first output terminal and a cathode terminal connected to a third output terminal of a second solar cell module that is different from the first solar cell module.

10. The circuit for diagnosing a solar cell module according to claim 9, further comprising a second interference prevention diode with a cathode terminal connected to the second output terminal and an anode terminal connected to a fourth output terminal of a third solar cell module that is different from the first and second solar cell modules.

\* \* \* \* \*